United States Patent
Chen et al.

(10) Patent No.: US 11,908,817 B2
(45) Date of Patent: Feb. 20, 2024

(54) BONDING STRUCTURE OF DIES WITH DANGLING BONDS

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Chih-Chia Hu, Taipei (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 691 days.

(21) Appl. No.: 17/113,357

(22) Filed: Dec. 7, 2020

(65) Prior Publication Data

US 2021/0118832 A1    Apr. 22, 2021

Related U.S. Application Data

(62) Division of application No. 16/371,863, filed on Apr. 1, 2019, now Pat. No. 10,861,808.

(60) Provisional application No. 62/770,396, filed on Nov. 21, 2018.

(51) Int. Cl.
| | | |
|---|---|---|
| *H01L 23/00* | (2006.01) | |
| *H01L 23/498* | (2006.01) | |
| *H03K 19/1776* | (2020.01) | |
| *H01L 23/495* | (2006.01) | |

(52) U.S. Cl.
CPC ........ *H01L 24/06* (2013.01); *H01L 23/49503* (2013.01); *H01L 23/49827* (2013.01); *H03K 19/1776* (2013.01)

(58) Field of Classification Search
None
See application file for complete search history.

(56) References Cited

U.S. PATENT DOCUMENTS

| | | | |
|---|---|---|---|
| 8,212,367 B2 | 7/2012 | Ronen | |
| 8,448,100 B1 | 5/2013 | Lin et al. | |
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,847,393 B2 | 9/2014 | Hoang et al. | |
| 9,123,615 B2 * | 9/2015 | Lin | .......... H01L 27/14685 |
| 9,196,643 B2 * | 11/2015 | Shimotsusa | .......... H01L 27/146 |

(Continued)

FOREIGN PATENT DOCUMENTS

| | | |
|---|---|---|
| CN | 101207113 A | 6/2008 |
| CN | 108074872 A | 5/2010 |

(Continued)

*Primary Examiner* — Bilkis Jahan
(74) *Attorney, Agent, or Firm* — Slater Matsil, LLP

(57) ABSTRACT

A method includes polishing a semiconductor substrate of a first die to reveal first through-vias that extend into the semiconductor substrate, forming a dielectric layer on the semiconductor substrate, and forming a plurality of bond pads in the dielectric layer. The plurality of bond pads include active bond pads and dummy bond pads. The active bond pads are electrically coupled to the first through-vias. The first die is bonded to a second die, and both of the active bond pads and the dummy bond pads are bonded to corresponding bond pads in the second die.

20 Claims, 24 Drawing Sheets

(56) References Cited

U.S. PATENT DOCUMENTS

| | | | |
|---|---|---|---|
| 9,240,330 B2 | 1/2016 | Takeda et al. | |
| 9,299,736 B2 | 3/2016 | Chen et al. | |
| 9,559,081 B1 | 1/2017 | Lai et al. | |
| 10,153,222 B2 | 12/2018 | Yu et al. | |
| 10,163,859 B2 | 12/2018 | Yu et al. | |
| 10,236,238 B2 | 3/2019 | Fuji et al. | |
| 2011/0102657 A1 | 5/2011 | Takahashi et al. | |
| 2011/0248404 A1* | 10/2011 | Chiu | H01L 21/6835 |
| | | | 257/773 |
| 2012/0187576 A1* | 7/2012 | Yu | H01L 25/0652 |
| | | | 257/777 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0167790 A1 | 6/2014 | Pechstein | |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0264772 A1 | 9/2014 | Horng et al. | |
| 2014/0266273 A1 | 9/2014 | Wang et al. | |
| 2015/0364434 A1 | 12/2015 | Chen et al. | |
| 2016/0190101 A1* | 6/2016 | Yu | H01L 21/76802 |
| | | | 257/774 |
| 2017/0200702 A1* | 7/2017 | Hung | H01L 25/50 |

FOREIGN PATENT DOCUMENTS

| | | |
|---|---|---|
| CN | 103503122 A | 1/2014 |
| FR | 2980036 A1 | 3/2013 |
| JP | 2012182455 A | 9/2012 |
| KR | 101252261 B1 | 4/2013 |
| KR | 20180030147 A | 3/2018 |
| TW | 201401474 A | 1/2014 |
| TW | 201539725 A | 10/2015 |
| TW | 201712824 A | 4/2017 |
| TW | 201715660 A | 5/2017 |

* cited by examiner

US 11,908,817 B2

BONDING STRUCTURE OF DIES WITH DANGLING BONDS

PRIORITY CLAIM AND CROSS-REFERENCE

This application is a divisional of U.S. patent application Ser. No. 16/371,863, entitled "Bonding Structure of Dies with Dangling Bonds," filed Apr. 1, 2019, which claims the benefit of the U.S. Provisional Application No. 62/770,396, filed Nov. 21, 2018, and entitled "Bonding Structure of Memory Dies with Dangling Bonds," which application is hereby incorporated herein by reference.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure may include device dies formed using different technologies and have different functions, bonded to the same device die, thus forming a system. This may save manufacturing cost and optimize device performance. For example, memory dies may be bonded to logic dies. Furthermore, the memory dies may form memory die stacks, with upper memory dies bonded to the corresponding lower memory dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
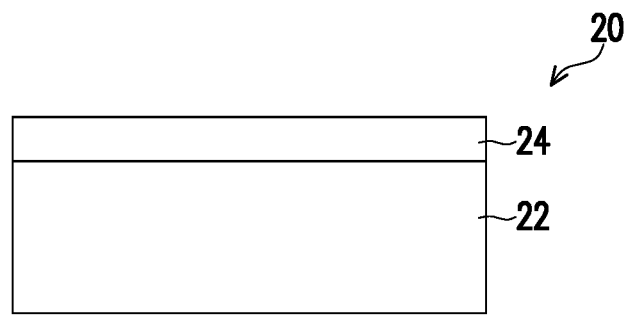
FIGS. 1 through 4 illustrate the cross-sectional views of intermediate stages in the formation of dummy dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including stacked dies and the method of forming the same are provided in accordance with various embodiments. The intermediate stages in the formation of the package are illustrated in accordance with some embodiments. Some variations of some embodiments are discussed. Throughout the various views and illustrative embodiments, like reference numbers are used to designate like elements. In accordance with some embodiments of the present disclosure, the package includes an upper die bonded to a bottom die, with the upper die including an active pad and a dangling pad. The lower die has a through-via penetrating through the respective semiconductor substrate. A dielectric layer is formed over the through-via, and an active bond pad and a dummy pad are formed in the dielectric layer. The dummy pad is bonded to the dangling pad to improve bond strength and to reduce problems in the bond structure.

FIGS. 1 through 23 illustrate the cross-sectional views of intermediate stages in the formation of a package in accordance with some embodiments of the present disclosure. The corresponding processes are also reflected schematically in the process flow shown in FIG. 33.

Figure 33:
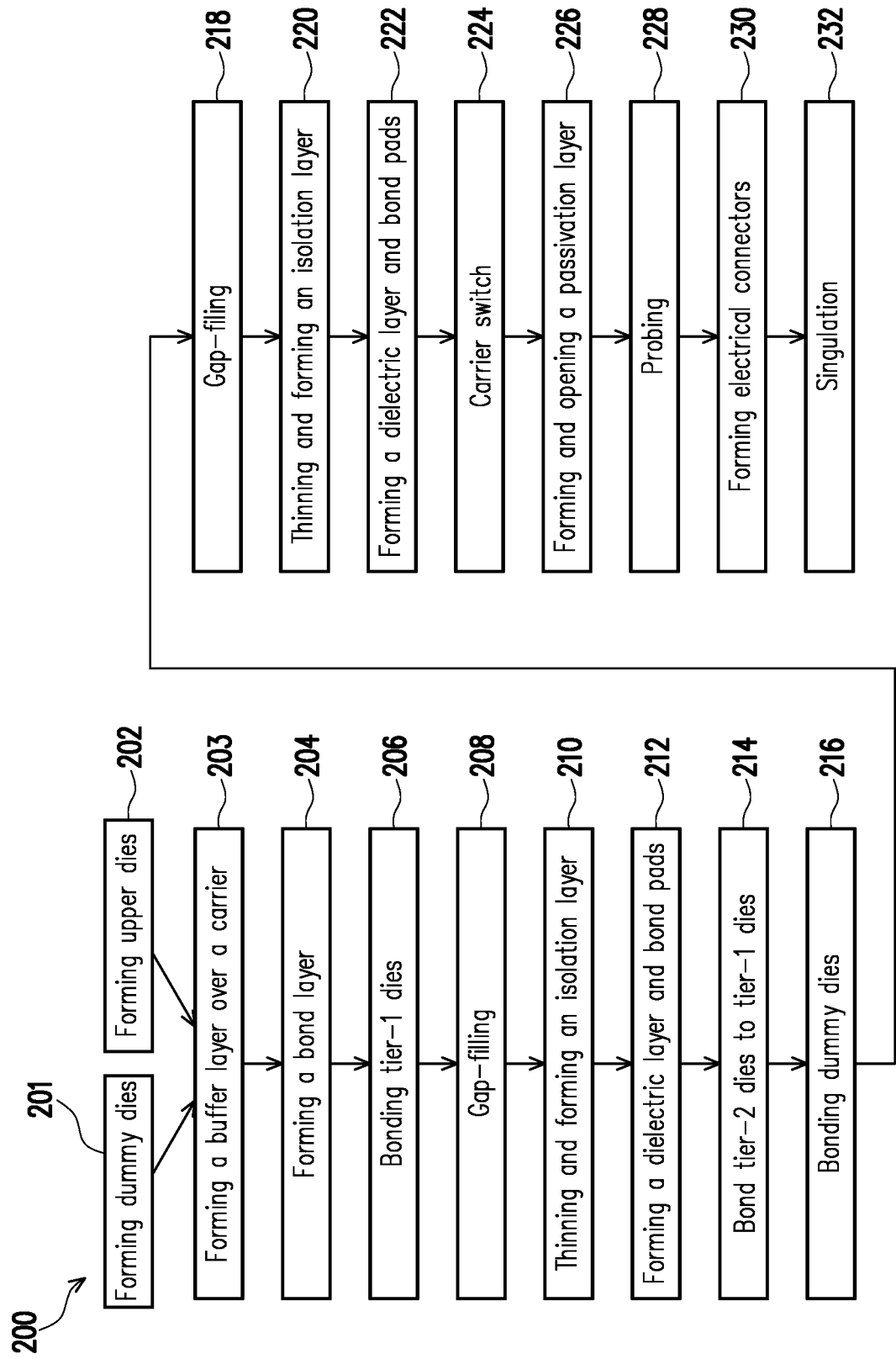
FIG. 33 illustrates a process flow for forming a package in accordance with some embodiments.

FIGS. 1 through 4 illustrate the formation of dummy dies in accordance with some embodiments, which dummy dies are placed in die stacks. The respective process is illustrated as process 201 in the process flow 200 as shown in FIG. 33. Referring to FIG. 1, wafer 20 is provided. Wafer 20 includes substrate 22, and buffer layer 24 over substrate 22. In accordance with some embodiments of the present disclosure, substrate 22 is a silicon substrate. In accordance with other embodiments, substrate 22 may be formed of a material having a Coefficient of Thermal Expansion (CTE) close to that of silicon, and a thermal conductivity close to or greater than that of silicon. Buffer layer 24 may be formed of a material that has a lower Young's modulus (hence is softer) than the subsequently formed bond layer 26 (FIG. 2), so that it may act as a stress-absorbing layer absorbing the stress from bond layer 26. For example, buffer layer 24 may be formed of a Tetra Ethyl Ortho Silicate (TEOS) oxide, Undoped Silicate Glass (USG), or the like. The formation of buffer layer 24 may include Plasma Enhanced Chemical Vapor Deposition (PECVD), Low-Pressure Chemical Vapor Deposition (LPCVD), Chemical Vapor Deposition (CVD), or the like.

Figure 2:
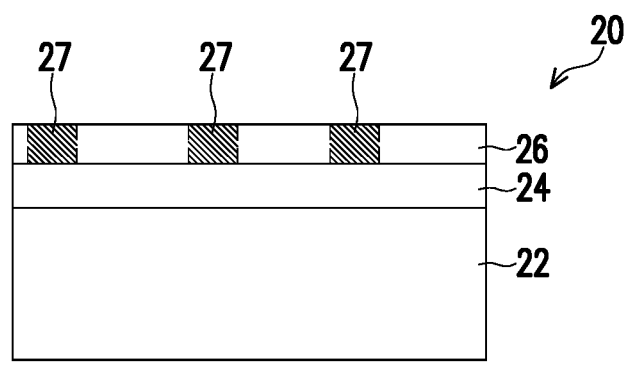

Referring to FIG. 2, bond layer 26 is formed. In accordance with some embodiments of the present disclosure, bond layer 26 is formed of an oxide, which may be a silicon-and-oxygen-containing oxide such as silicon oxide, silicon oxynitride, or the like. Bond layer 26 may be formed using PECVD, LPCVD, CVD, or the like.

In accordance with some embodiments, dummy metal pads 27 are formed in bond layer 26. In accordance with some embodiments, no dummy metal pads are formed in bond layer 26. Dummy metal pads 27 may be formed of, for example, copper, and there may or may not be diffusion barrier layers formed to separate the copper in dummy metal pads 27 from bond layer 26 and buffer layer 24. Dummy metal pads 27 may be formed using a single damascene process in accordance with some embodiments.

Figure 3:
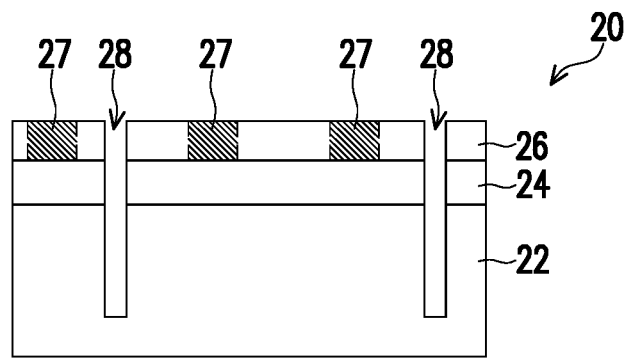

FIG. 3 illustrates the formation of trenches 28 in wafer 20. When viewed from the top of wafer 20, trenches 28 form a grid. Trenches 28 extend from the top surface of bond layer 26 to an intermediate level of substrate 22, with the intermediate level being between the top surface and the bottom surface of substrate 22. Trenches 28 may be formed using a blade, a laser beam, or the like.

Figure 4:
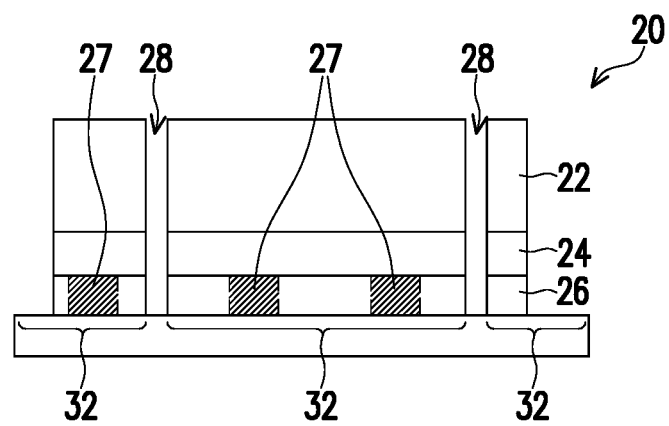

FIG. 4 illustrates the singulation of wafer 20 through a grinding process. In accordance with some embodiments of the present disclosure, wafer 20 is flipped upside down, and is attached to tape 30. A grinding process is then performed from the backside of wafer 20 to thin substrate 22, until the portions of wafer 20 over trenches 28 are removed. Accordingly, wafer 20 is separated into discrete dummy dies 32. The resulting dummy dies 32 are free from active devices and passive devices, and may be free from metals therein. In accordance with some embodiments, dummy dies 32 include substrate 22 and planar dielectric layers, and are free from other metal features, except dummy bond pads 27 may be formed.

Figure 5:
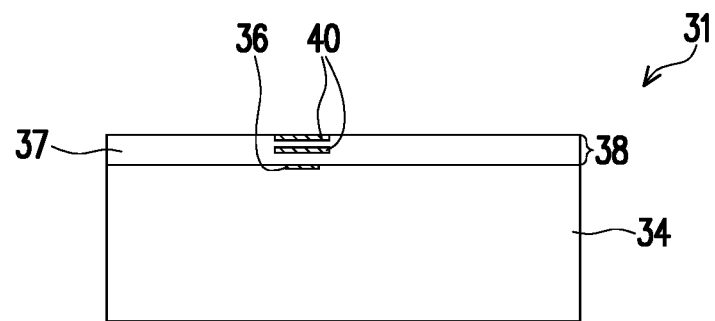
FIGS. 5 through 10 illustrate the cross-sectional views of intermediate stages in the formation of device dies in accordance with some embodiments.

FIGS. 5 through 10 illustrate the formation of upper dies, which are such named since they are used as upper-level dies in the formation of packages. The respective process is illustrated as process 202 in the process flow 200 as shown in FIG. 33. In accordance with some embodiments of the present disclosure, upper dies are memory dies, while the upper dies may be logic dies, Input-Output (IO) dies, or the like. The memory dies may be Static Random Access Memory (SRAM) dies, Dynamic Random Access Memory (DRAM) dies, NAND memory dies, Resistive Random Access Memory (RRAM) dies, Magneto-resistive Random Access Memory (MRAM) dies, or the like. As shown in FIG. 5, wafer 31 is illustrated. Wafer 31 includes semiconductor substrate 34, which may be a silicon substrate, silicon germanium substrate, or the like in accordance with some embodiments. Integrated circuit devices 36 are formed, for example, at the top of semiconductor substrate 34. Integrated circuit devices 36 may include transistors, resistors, capacitors, inductors, and/or the like. Integrated circuit devices 36 may perform the memory function, logic function, IO function, or the like. Interconnect structure 38 is formed over semiconductor substrate 34, and includes dielectric layers 37 and metal lines and vias 42 in dielectric layers 37. Metal lines and vias 42 are electrically connected to integrated circuit devices 36.

Figure 6:
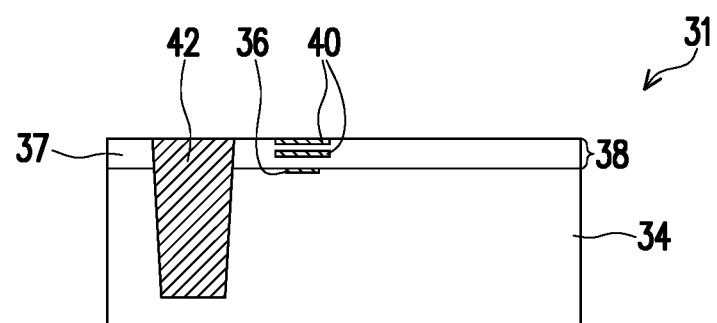

Referring to FIG. 6, through-vias 42 is formed to extend into semiconductor substrate 34. In accordance with some embodiments, through-vias 42 extend from a top surface of interconnect structure 38 into semiconductor substrate 34. In accordance with alternative embodiments, through-vias 42 are pre-formed in semiconductor substrate 34 before the formation of the entire, or an upper part of, interconnect structure 38. Through-vias 42 may be formed of a conductive material such as tungsten, copper, or the like. An isolation layer (not shown) may be formed to encircle each of through-vias 42 to electrically insulate the corresponding through-via 42 from semiconductor substrate 34. The formation of through-vias 42 may include etching dielectric layers 37 and semiconductor substrate 34 to form openings, and filling the openings with the isolation layer and the conductive material. A planarization process such as a Chemical Mechanical Polish (CMP) process or a mechanical grinding process may be performed to level the top surfaces of through-vias 42 with the top surface of the top dielectric layer 37.

Figure 7:
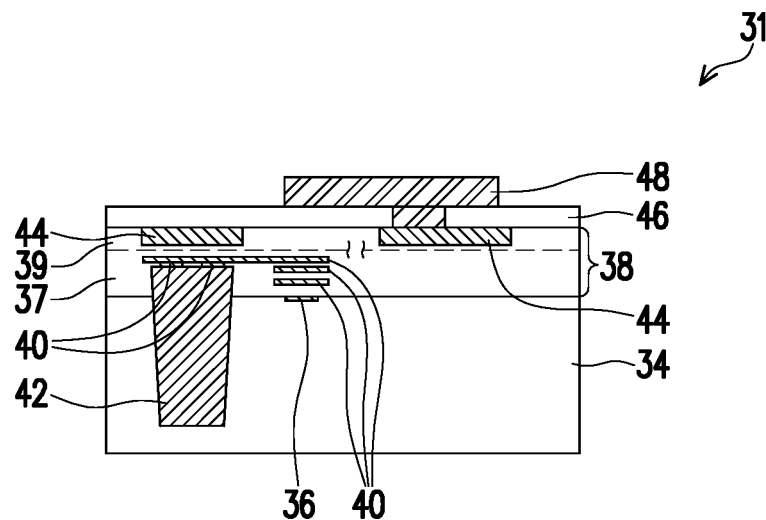

FIG. 7 illustrates the further formation of wafer 31. In accordance with some embodiments, the formation includes forming dielectric layers 39 and metal lines and vias 40 to extend interconnect structure 38, forming top metal pads 44 in a top layer of the dielectric layers 39, forming passivation layer 46, and forming metal pads 48. In accordance with some embodiments of the present disclosure, some of dielectric layers 37 and 39 are formed of low-k dielectric materials. Passivation layer 46 may be formed of a non-low-k dielectric material having a dielectric constant equal to or higher than the dielectric constant of silicon oxide (3.9). Metal pads 48 may be formed of aluminum or aluminum copper.

Figure 8:
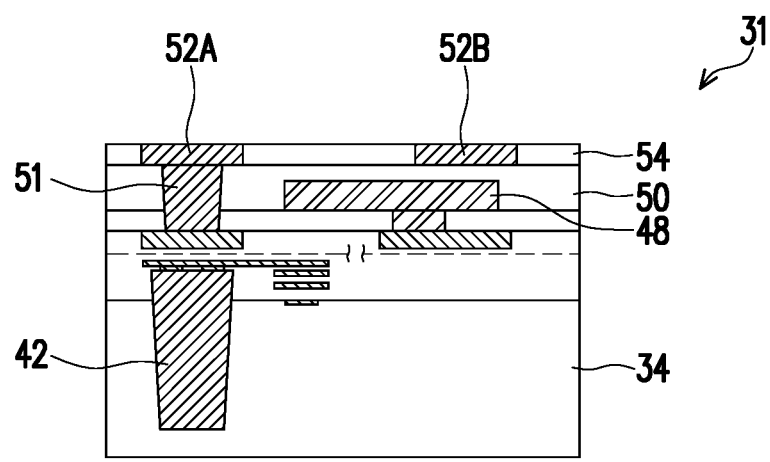

FIG. 8 illustrates the formation of dielectric layer 50, vias 51, dielectric layer 54, and bond pads 52A and 52B in dielectric layer 54. In accordance with some embodiments, as shown in FIG. 8, dielectric layers 50 and 54 are separate dielectric layers formed in different formation processes. In accordance with alternative embodiments, dielectric layers 50 and 54 are parts of the same dielectric layer that is formed in a same formation process. Dielectric layer 54 may be formed of a silicon-and-oxygen containing dielectric material such as silicon oxide, silicon oxynitride, or the like. Dielectric layer 50 may be formed of a same material as the material of dielectric layer 54, or may be formed of a material different from that of dielectric layer 54. For example, dielectric layer 50 may be formed silicon oxide, silicon oxynitride, silicon nitride, silicon carbo-nitride, or the like. Bond pads 52A and 52B and vias 51 may be formed of copper, and may be formed using single or dual damascene processes. The top surfaces of dielectric layer 54 and bond pads 52A and 52B are coplanar.

Figure 9:
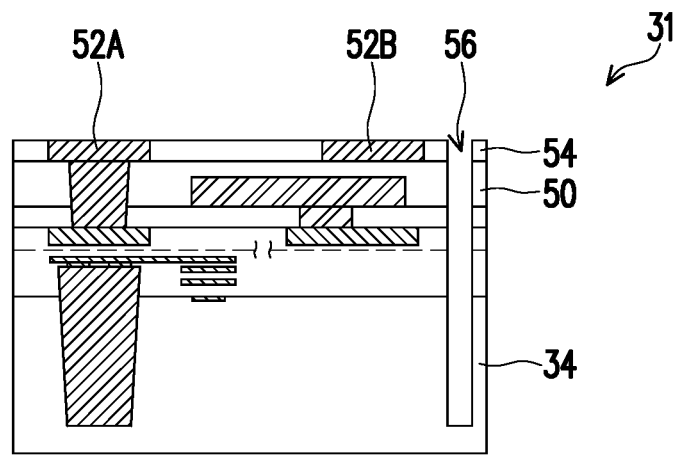

FIG. 9 illustrates the formation of trenches 56 in wafer 31. When viewed from the top of wafer 31, trenches 56 form a grid, with one of the trenches 56 illustrated as an example. Trenches 56 extend from the top surface of dielectric layer 54 to an intermediate level of semiconductor substrate 34, with the intermediate level being between the top surface and the bottom surface of semiconductor substrate 34. Trenches 56 may be formed using a blade, a laser beam, or the like.

Figure 10:
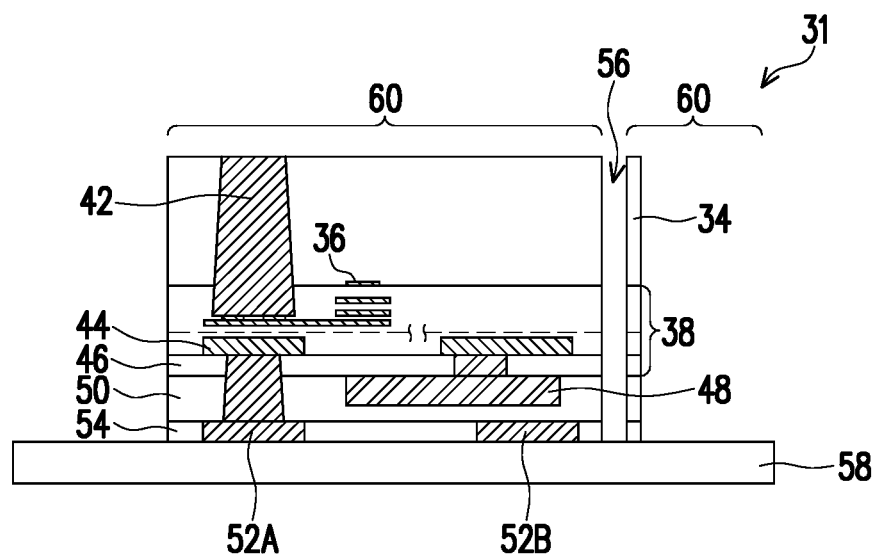

FIG. 10 illustrates the singulation of wafer 31 through a grinding process. In accordance with some embodiments of the present disclosure, wafer 31 is flipped upside down, and is attached to tape 58. A grinding process is then performed from the backside of wafer 31 to thin semiconductor substrate 34, until the portions of semiconductor substrate 34 over trenches 56 are removed. Accordingly, wafer 31 is separated into discrete dies 60 that are identical to each other.

Figure 11:
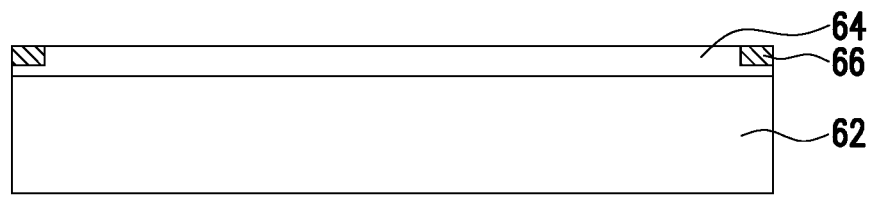
FIGS. 11 through 23 illustrate the cross-sectional views of intermediate stages in the formation of packages with stacked dies in accordance with some embodiments.

FIGS. 11 through 23 illustrate the cross-sectional views in the packaging of dummy dies 32 (FIG. 4) and dies 60 (FIG. 10) to form a package. Referring to FIG. 11, carrier 62 is provided. In accordance with some embodiments, carrier 62 is formed of silicon, glass, or the like, and is provided in a wafer form, which is large enough to accommodate a plurality of device dies that will be bonded thereon. Dielectric layer 64 is formed on carrier 62. The respective process is illustrated as process 203 in the process flow 200 as shown in FIG. 33. In accordance with some embodiments of the present disclosure, dielectric layer 64 is formed of a relatively soft material, which is softer than the subsequently formed bond layer 68, and hence is used as a buffer layer for absorbing stress. Dielectric layer 64 may be formed of a TEOS oxide, USG, or the like. The formation of dielectric layer 64 may include PECVD, LPCVD, CVD, or the like. In accordance with some embodiments, metal features 66 are formed in dielectric layer 64. Metal features 66 may be used as alignment marks for aligning the subsequent placement and the bonding of device dies. Metal features 66 may be formed, for example, through damascene processes.

Figure 12:
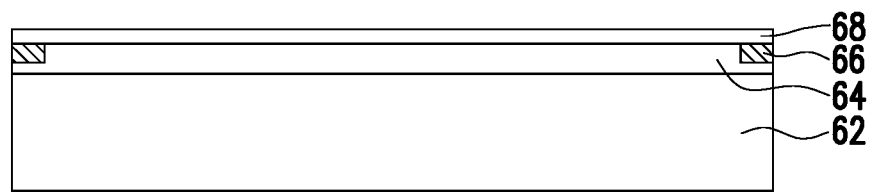

Referring to FIG. 12, bond layer 68 is formed. The respective process is illustrated as process 204 in the process flow 200 as shown in FIG. 33. In accordance with some embodiments of the present disclosure, bond layer 68 is formed of an oxide, which may be a silicon-and-oxygen-containing oxide such as silicon oxide, silicon oxynitride, or the like. Bond layer 68 may be formed using PECVD, LPCVD, CVD, or the like. The formation of bond layer 68 may include a deposition process followed by a planarization process.

Figure 13:
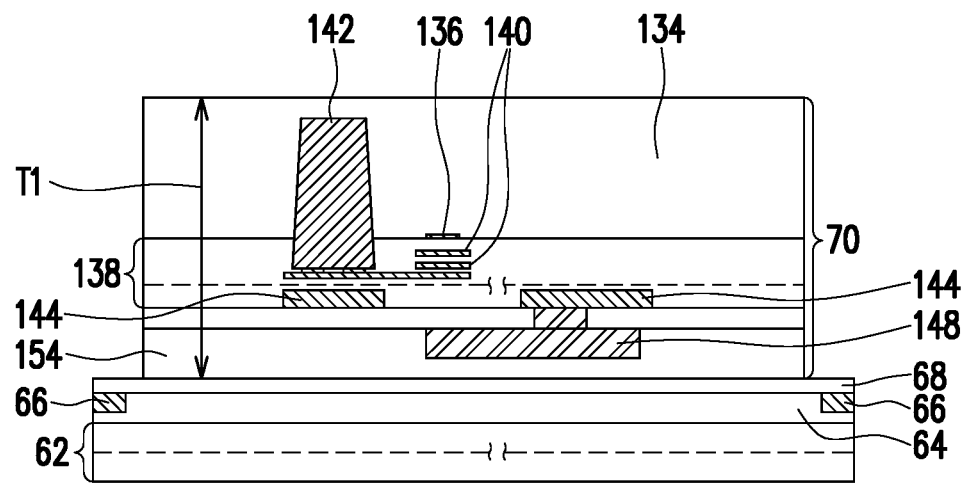

FIG. 13 illustrates the placement and the bonding a of tier-1 die(s) 70 on bond layer 68. The respective process is illustrated as process 206 in the process flow 200 as shown in FIG. 33. Although one tier-1 die 70 is shown, a plurality of tier-1 dies 70 are placed and bonded onto bond layer 68. The plurality of tier-1 dies 70 may be arranged as an array. Alignment marks 66 are used for aligning tier-1 die(s) 70 to intended positions. In accordance with some embodiments, tier-1 dies 70 are logic dies, which may be Application Processor (AP) dies, Graphics Processing Unit (GPU) dies, Field Programmable Gate Array (FPGA) dies, Application-Specific Integrated Circuit (ASIC) dies, Input-Output (IO) dies, Network Processing Unit (NPU) dies, Tensor Processing Unit (TPU) dies, Artificial Intelligence (AI) engine dies, or the like. The features in logic dies 70 are marked corresponding to the marking of dies 60 (FIG. 10), except the reference numbers of the features in tier-1 dies 70 are increased over the reference numbers of the like corresponding features in dies 60 by number 100. For example, logic dies 70 may include semiconductor substrate 134, integrated circuit devices 136, interconnect structure 138, metal lines and vias 140, through-vias 142, metal pads 144 and 148, and bond layer 154. The formation of dies 70 may include process steps similar to what are shown in FIGS. 5 through 7, followed by the formation of bond layer 154 (FIG. 13), and then the processes shown in FIGS. 9 and 10. Some materials of the marked features of tier-1 dies 70 may also be similar to the materials of the corresponding features in dies 60. Tier-1 dies 70 may have structures different from the structures of dies 60 (FIG. 10). As shown in FIG. 13, metal pads 148 are embedded in a dielectric layer such as bond layer 154. In accordance with some embodiments, tier-1 dies 70 have thickness T1 in the range between about 50 μm and about 150 μm.

The bonding of dies 70 to bond layer 64 may be through fusion bonding (dielectric-to-dielectric bonding), which may form Si—O—Si bonds to bond the bond layers 154 and 68 together.

Figure 14:
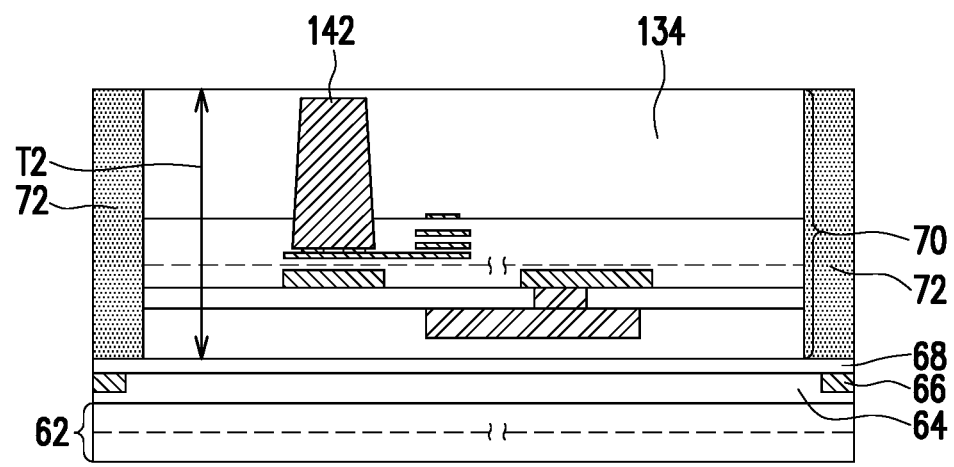

FIG. 14 illustrates a gap-filling process to form dielectric regions 72, which fill the gaps between, and encircling, tier-1 dies 70. The respective process is illustrated as process 208 in the process flow 200 as shown in FIG. 33. In accordance with some embodiments, the gap-filling process includes dispensing or coating a flowable dielectric material, and then curing the flowable dielectric material. The corresponding dielectric region 72 may be formed of molding compound, molding underfill, resin, epoxy, or the like. In accordance with alternative embodiments, the formation of dielectric regions 72 may include depositing one or a plurality of dielectric material layers. For example, dielectric regions 72 may include a dielectric liner formed of silicon nitride, and another dielectric material (such as silicon oxide) over the dielectric liner. A planarization process such as a CMP process or a mechanical grinding process may be performed to remove excess dielectric materials, and to level the top surface of semiconductor substrate 134 with dielectric regions 72. In accordance with some embodiments, after the gap-filling process, tier-1 dies 70 have thickness T2 in the range between about 10 μm and about 15 μm.

Figure 15:
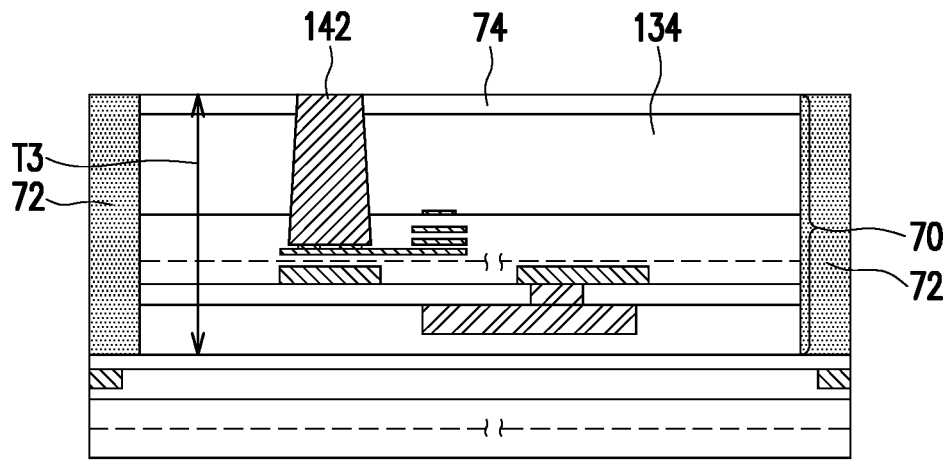

FIG. 15 illustrates a backside grinding process to thin tier-1 dies 70 and reveal through-vias 142. The respective process is illustrated as process 210 in the process flow 200 as shown in FIG. 33. The backside grinding process may be a continued part of the planarization process as shown in FIG. 14, or may be a separate process performed separately from the planarization process as shown in FIG. 14. After the backside grinding process, semiconductor substrate 134 is also revealed, with its top surface being coplanar with the top surfaces of through-vias 142 and dielectric regions 72. Next, semiconductor substrate 134 is etched using an etchant that attacks semiconductor substrate 134, and does not attack rough-vias 142 and dielectric region 72. As a result, a recess is formed, with the top portions of through-vias 142 located in the recess and protruding out of the top surface of the remaining portion of semiconductor substrate 134. In a subsequent process, isolation layer 74 is formed. The respective process is also illustrated as process 210 in the process flow 200 as shown in FIG. 33. Isolation layer 74 is formed of a dielectric material, which may include silicon oxide, silicon nitride, silicon oxynitride, silicon oxy-carbide, or the like. A planarization process is then performed to level the top surfaces of through-vias 142, isolation layer 74, and dielectric regions 72. In accordance with some embodiments, after the formation of isolation layer 74, tier-1 dies 70 have thickness T3 in the range between about 3 μm and about 10 μm.

Figure 16:
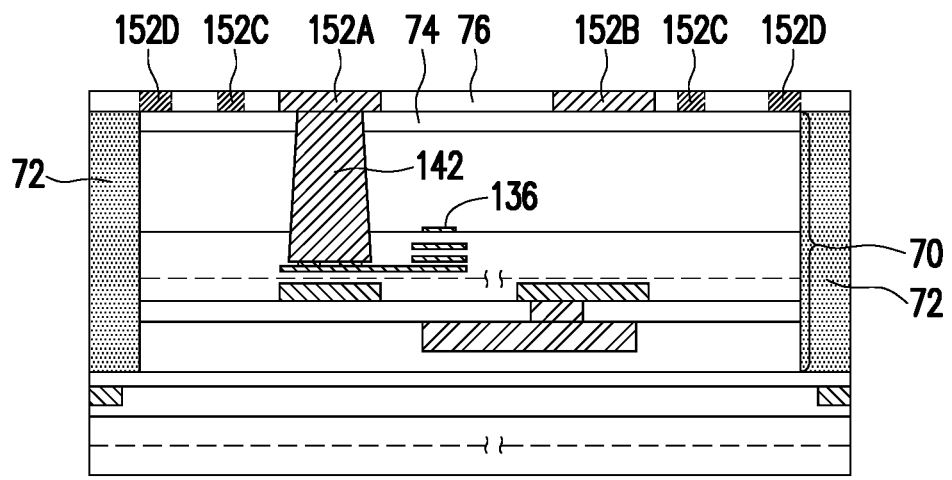

FIG. 16 illustrates the formation of bond layer 76 and bond pads 152A and 152B in bond layer 76. The respective process is illustrated as process 212 in the process flow 200 as shown in FIG. 33. Bond layer 76 may be formed of a silicon-and-oxygen-containing dielectric material such as silicon oxide, silicon oxynitride, or the like. The formation method may include CVD, ALD, PECVD, or the like. Bond pads 152A and 152B may include copper, and may be formed using a single damascene process. The top surfaces of bond layer 76 and bond pads 152A and 152B are coplanar. In accordance with some embodiments, bond pads 152A are active bond pads that are electrically and/or signally coupled to integrated circuit devices 136. Bond pads 152B, on the other hand, are dummy bond pads that are electrically floating at this time. Bond pads 152B may have bottom surfaces contacting the top surface of isolation layer 74.

In accordance with some embodiments of the present disclosure, bond pads 152C and 152D are also formed simultaneously when bond pads 152A and 152B are formed. The function and the positions of bond pads 152C and 152D are discussed in detail in subsequent paragraphs referring to FIGS. 27 through 32. In accordance with alternative embodiments of the present disclosure, either one or both of bond pads 152C and 152D are not formed.

Figure 17:
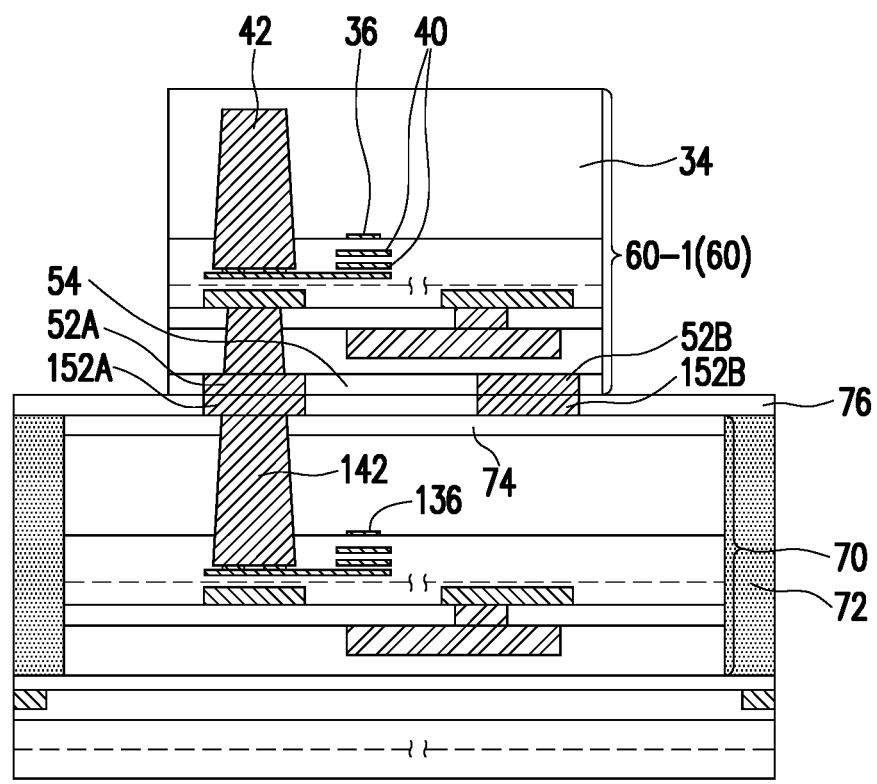

Referring to FIG. 17, device die(s) 60 are bonded to device dies 70. Device dies 60 are also referred to as tier-2 dies 60-1. The respective process is illustrated as process 214 in the process flow 200 as shown in FIG. 33. Throughout the description, the reference number of a feature may be follow by a dash sign and an integer for the identification of their tier-levels. For example, dies 60 may be identified as 60-1, 60-2, . . . **60-*n* (FIG. 20) according to their tier levels. In accordance with some embodiments of the present disclosure, the bonding may include fusion bonding, which includes the direct metal bonding between bond pads 152A/152B and bond pads 52A/52B, and the dielectric-to-dielectric bonding between dielectric layer 54 and dielectric layer 76. After the bonding, bond pads 152A and 52A, which are bonded together, are used for the electrical and/or signal connection between tier-2 die 60-1 (which may be a memory die) and tier-1 die 70. For example, integrated circuit devices 36 (which may include memory cells) in tier-2 dies 60-1 are electrically and/or signal connected to integrated circuit devices 136 in tier-1 dies 70 through bond pads 152A and 52A**.

Figure 25:
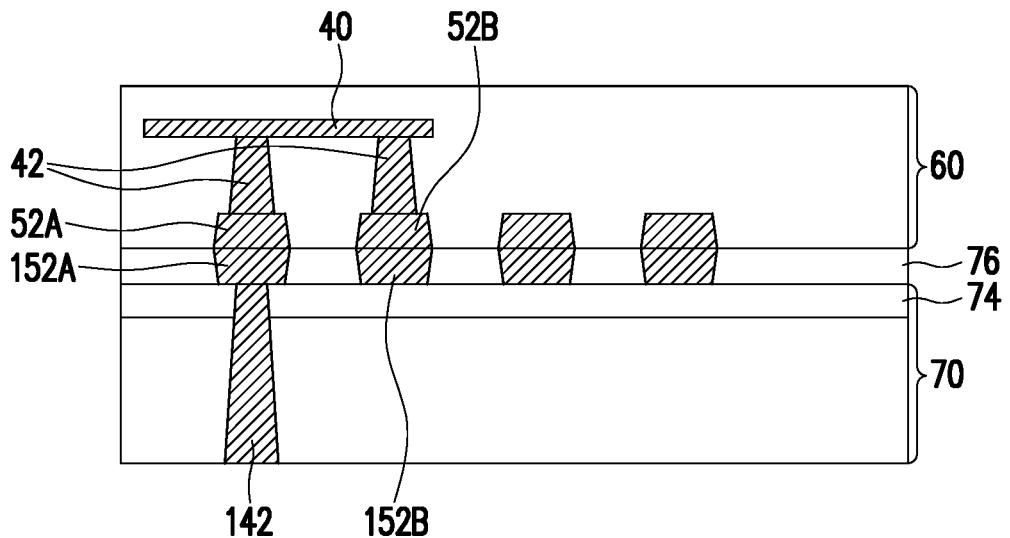

Bond pad 52B is a dangling bond, which is schematically illustrated in FIG. 25 to show some details. Bond pad 52B is electrically connected to integrated circuit devices 36 (FIG. 17) (even when the respective device die 60 is still a discrete die). When the resulting package 96 (FIG. 23) is powered on, dangling bond pad 52B may have a voltage received from integrated circuit devices 36. If tier-2 die 60-1 is used in other circuits or other parts of the resulting package, for example, as a tier-3 die as will be discussed in subsequent paragraphs, bond pad 52B may be a functional (active) pad that conducts voltages and/or currents. In accordance with some embodiments of the present disclosure, since tier-2 die 60-1 is connected to tier-1 die 70, bond pad 52B does not have an electrical and signal function, and hence is dangling. Accordingly, voltages may be applied on bond pads 52B and 152B, but there is no current flowing through bond pads 52B and 152B since bond pad 152B is a terminal node of the current/voltage path.

Figure 18:
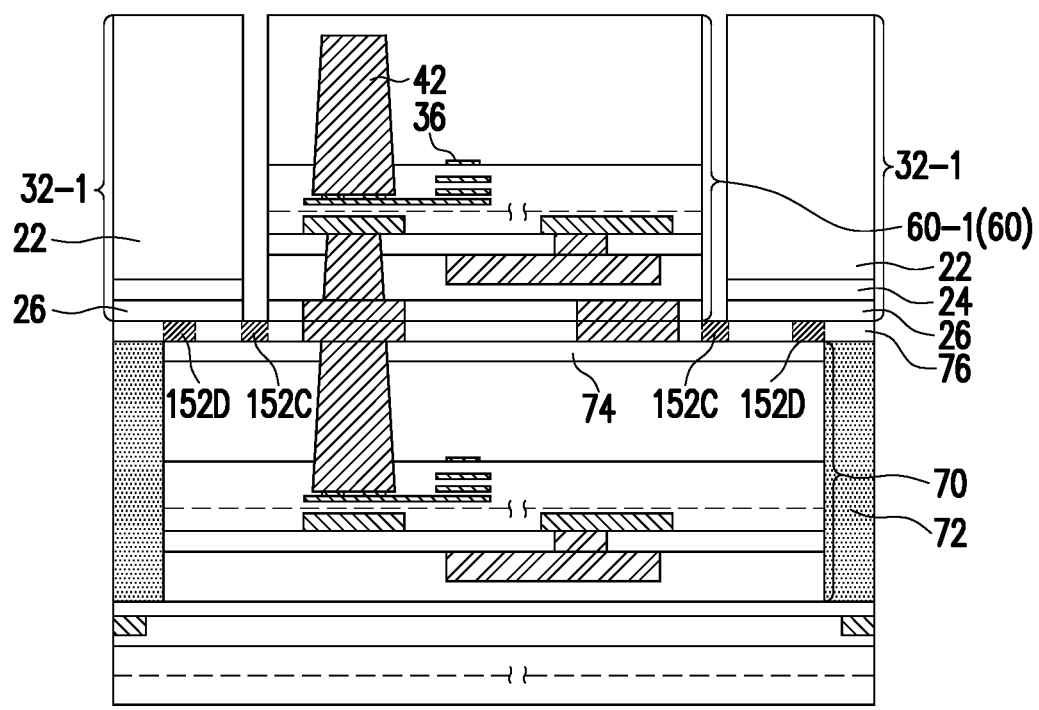
Figure 19:
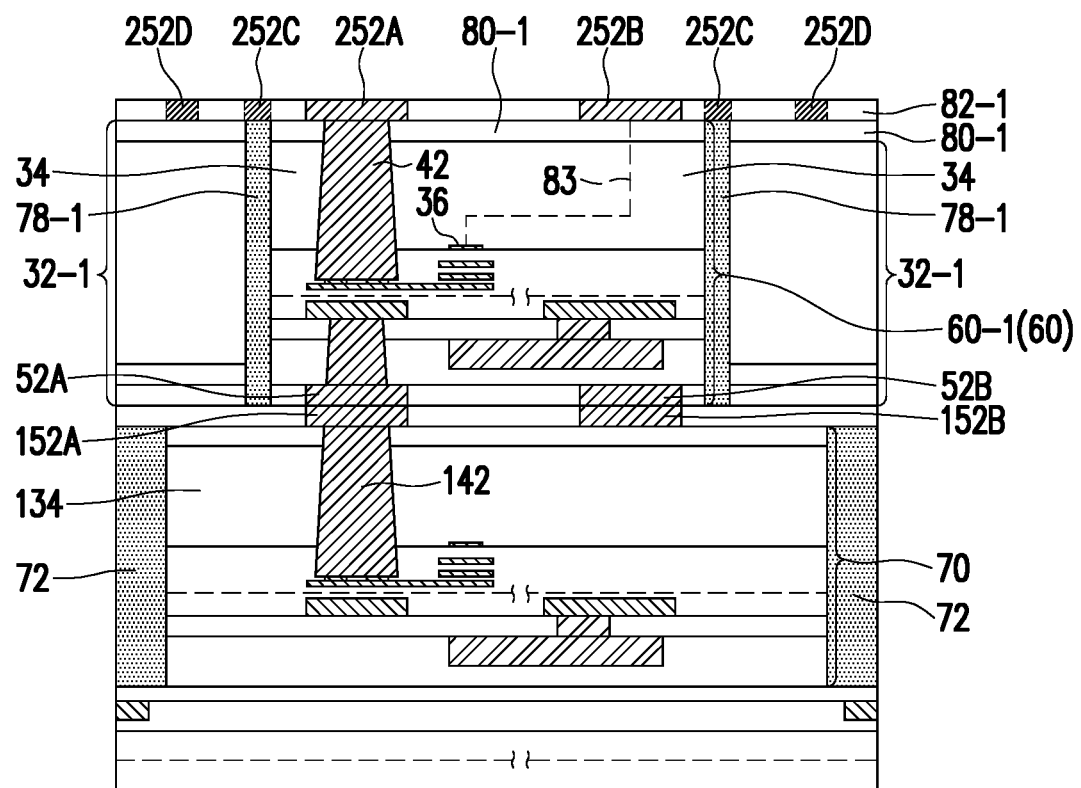

FIG. 18 illustrates the bonding of dummy dies 32-1 to dielectric layer 76. The respective process is illustrated as process 216 in the process flow 200 as shown in FIG. 33. The bonding may be through fusion bonding, with dielectric layers 26 in dummy dies 32-1 bonded to dielectric layer 76. Since there are a plurality of tier-2 dies 60-1 (with one illustrated), dummy dies 32-1 are placed between the plurality of tier-2 dies 60-1 to occupy the spaces that otherwise will be occupied by gap-filling material 78-1 (FIG. 19). Since dummy dies 32-1 have EOTs close to that of tier-1 dies 70 and tier-2 dies 60, the addition of dummy dies 32-1 reduces the stress and warpage in the resulting package.

FIG. 19 illustrates a gap-filling process to form dielectric regions 78-1 encircling tier-2 dies 60-1. The respective process is illustrated as process 218 in the process flow 200 as shown in FIG. 33. In accordance with some embodiments, the gap-filling process includes dispensing or coating a flowable dielectric material, and then curing the flowable dielectric material. The corresponding dielectric region 78-1 may be formed of molding compound, molding underfill, resin, epoxy, or the like. In accordance with alternative embodiments, the formation of dielectric regions 78-1 may include depositing one or plurality of dielectric material layers. For example, dielectric regions 78-1 may include a dielectric liner formed of silicon nitride, and another dielectric material (such as silicon oxide) over the dielectric liner. A planarization process such as a CMP process or a mechanical grinding process may be performed to remove excess dielectric materials, and to level the top surface of semiconductor substrate 34 with dielectric regions 78-1.

In subsequent processes, a backside grinding process is performed to thin tier-2 dies 60-1 and dummy dies 32-1, and to reveal through-vias 42. The respective process is illustrated as process 220 in the process flow 200 as shown in FIG. 33. After the backside grinding process, semiconductor substrate 34 is also revealed, with its top surface being coplanar with the top surfaces of through-vias 42 and dielectric regions 78-1. Next, semiconductor substrate 34 is etched to form a recess, with the top portions of through-vias 42 located in the recess and protruding out of the top surface of the remaining portion of semiconductor substrate 34. In a subsequent process, isolation layer 80-1 is formed in the recess. The respective process is also illustrated as process 220 in the process flow 200 as shown in FIG. 33. Isolation layer 80-1 is formed of a dielectric material, which may include silicon oxide, silicon nitride, silicon oxynitride, silicon oxy-carbide, or the like. A planarization process is then performed to level the top surfaces of through-vias 42, isolation layer 80-1, and dielectric regions 78-1.

FIG. 19 further illustrates the formation of bond layer 82-1 and bond pads 252A and 252B in bond layer 82-1. The respective process is illustrated as process 222 in the process flow 200 as shown in FIG. 33. Bond layer 82-1 may be formed of a silicon-and-oxygen-containing dielectric material such as silicon oxide, silicon oxynitride, or the like. The formation method may include CVD, ALD, PECVD, or the like. Bond pads 252A and 252B may be formed of copper, and may be formed using a single damascene process. The top surfaces of bond layer 82-1 and bond pads 252A and 252B are coplanar. In accordance with some embodiments, bond pads 252A are active bond pads that are electrically coupled to the integrated circuits such as 36. For example, when dies 60-1 and the subsequently bonded die 60-2 are identical to each other, bond pads 252B may be active bond pads same as bond pads 252A. FIG. 19 schematically illustrates dashed line 83 representing the conductive features electrically connecting bond pads 252B to integrated circuit devices 36, which conductive features may include a through-via and metal pads, metal lines, vias, or the like. Bond pads 252B may also be dummy bond pads in accordance with alternative embodiments. In accordance with some embodiments, there is a one-to-one correspondence between bond pads 252A/252B and the underlying bond pads 52A/52B (and 152A/152B), with each of bond pads 252A/252B vertically aligned to and overlapping a corresponding bond pad 52A/52B and a corresponding bond pad 152A/152B.

In accordance with some embodiments of the present disclosure, bond pads 252C and 252D are also formed simultaneously when bond pads 252A and 252B are formed. The function and the positions of bond pads 252C and 252D are discussed in detail in subsequent paragraphs referring to FIGS. 27 through 32.

Figure 20:
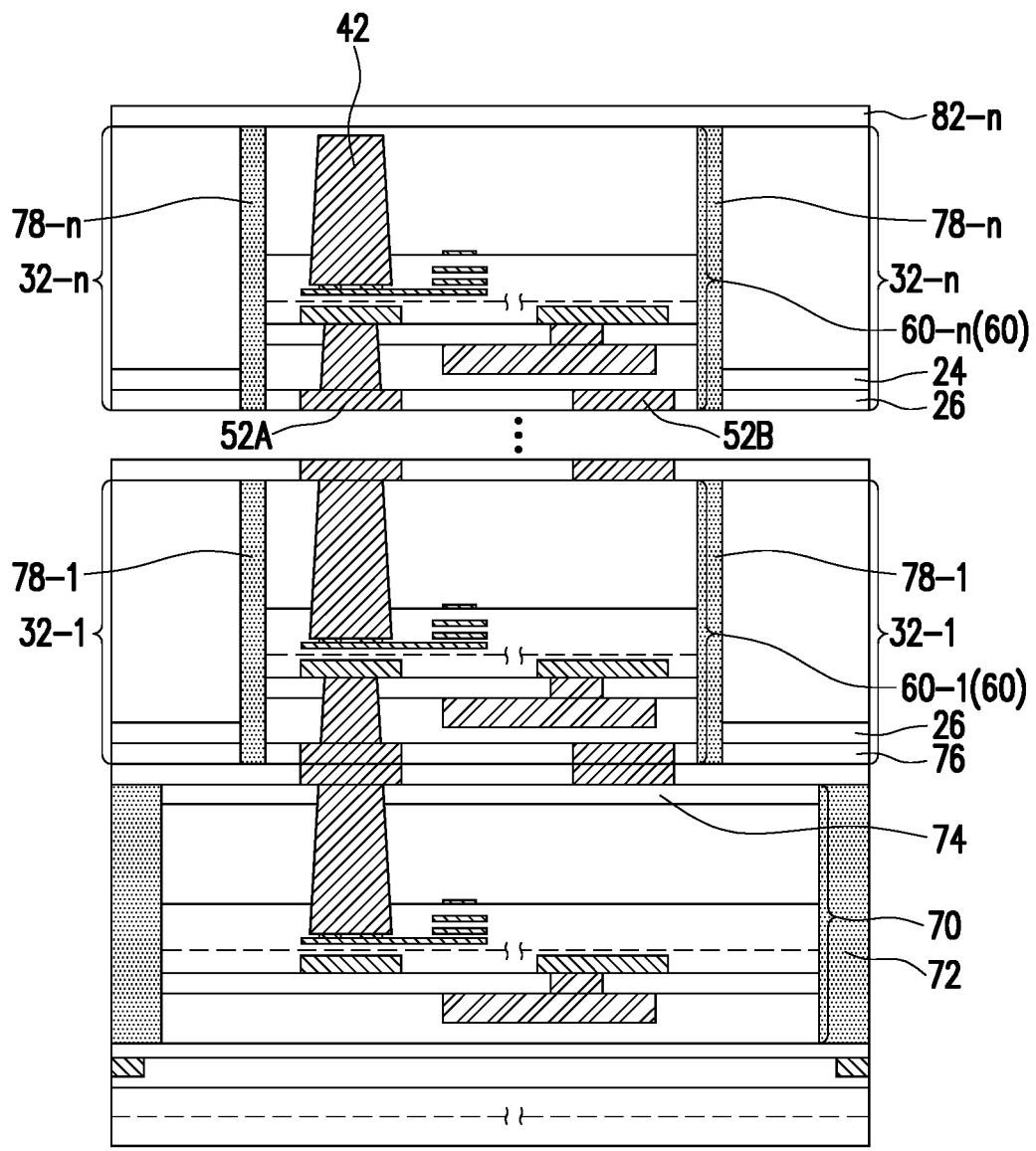

FIG. 20 illustrates the repetition of the processes shown in FIGS. 17 through 19 to stack more tiers of dies 60. For example, it is assumed that there are n tiers of dies 60, with the top-tier dies referred to as tier-n dies **60-*n*. Integer n may be any number equal to or greater than 2. The upper-tier dies 60-2 through 60-*n* may be identical to, or different from, tier-2 die 60-1. After the top-tier dies 60-*n* and dummy dies 32-*n* are bonded, gap filling regions 78-*n* are formed and planarized, followed by the formation of dielectric layer 82-*n***, which may also be a bond layer.

Figure 21:
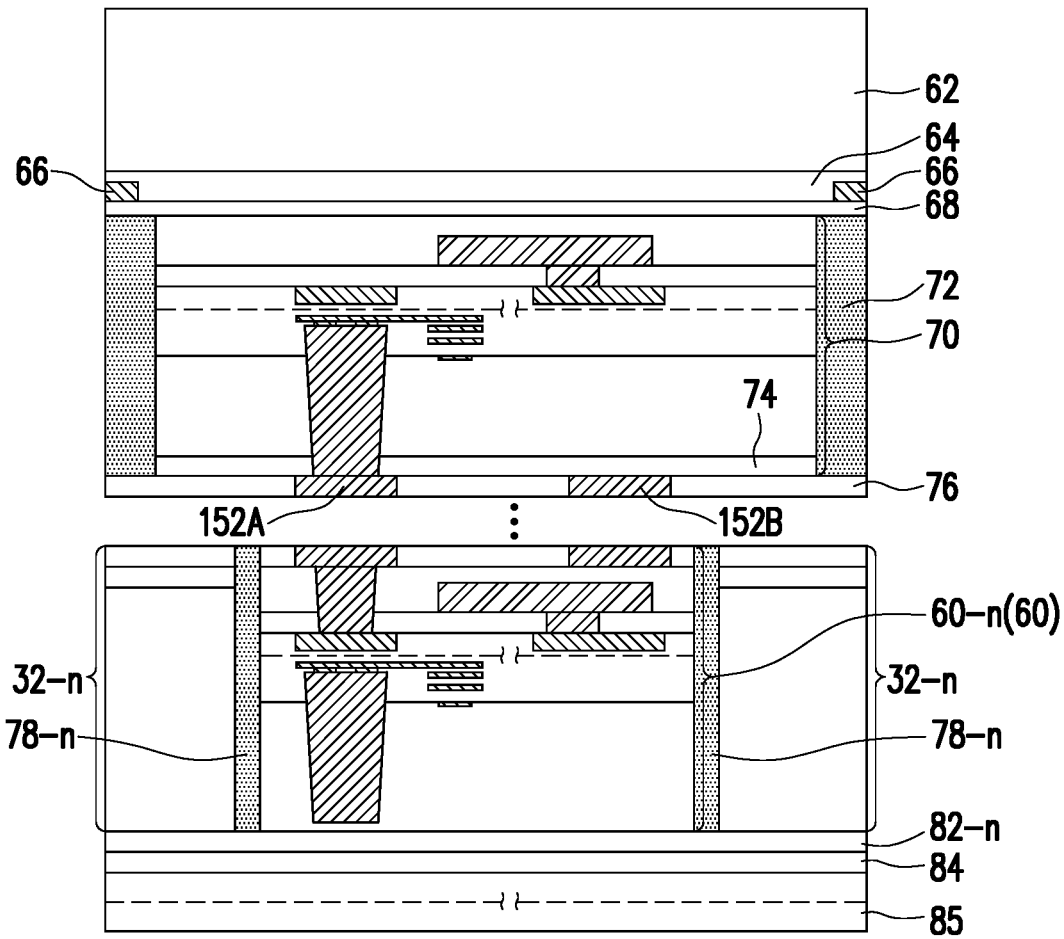
Figure 22:
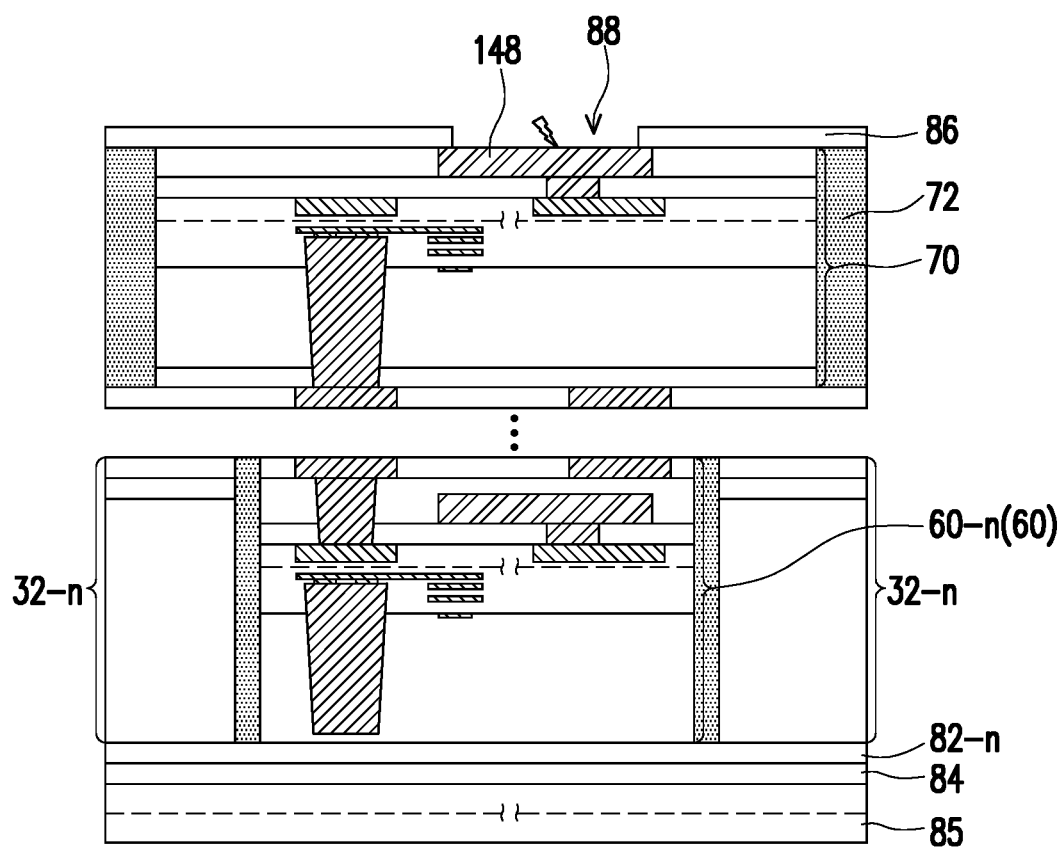

FIG. 21 illustrates a carrier-switch process. The respective process is illustrated as process 224 in the process flow 200 as shown in FIG. 33. Carrier 85 is bonded to bonding layer **82-*n* through bond layer 84, with the bonding method being fusion bonding. In accordance with some embodiments, carrier 85 is formed of silicon, and is a blank carrier free from active devices, passive devices, conductive lines, or the like. Bond layer 84** may be formed of a silicon-and-oxygen-containing material such as silicon oxide, silicon oxynitride, or the like.

Next, carrier 62, buffer layer 64, and bond layer 68 are removed, for example, in a CMP process or a mechanical grinding process. In subsequent processes, passivation layer 86 is formed, which may include silicon oxide, silicon nitride, or composite layers thereof. Opening 88 is formed in passivation layer 86. The respective process is illustrated as process 226 in the process flow 200 as shown in FIG. 33. The resulting structure is shown FIG. 22. A probing process may then be performed, for example, by contacting the probe pins of a probe card (not shown) with metal pads 148 in order to determine whether the resulting package is defective or not. Known good packages are recorded. The respective process is illustrated as process 228 in the process flow 200 as shown in FIG. 33.

Figure 23:
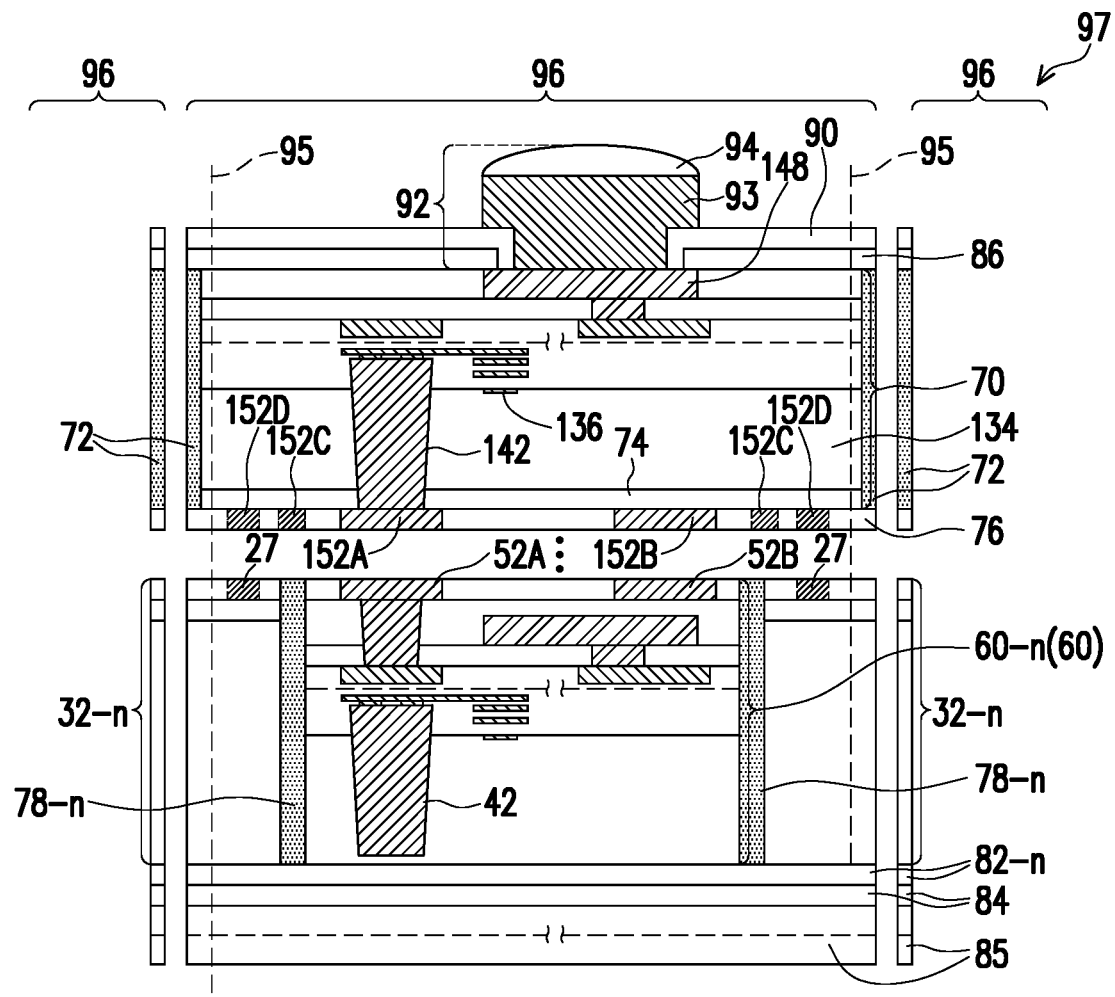

FIG. 23 illustrates the formation of polymer layer 90, which may be formed of polyimide, polybenzoxazole (PBO), benzocyclobutene (BCB), or the like. Electrical connectors 92, which may include metal pillars 93 and solder regions 94, are then formed on metal pads 148. The respective process is illustrated as process 230 in the process flow 200 as shown in FIG. 33. The resulting structure is referred to as reconstructed wafer (a package) 97. In a subsequent process, a singulation process is performed on the reconstructed wafer 97, and a plurality of identical packages 96 are formed. The respective process is illustrated as process 232 in the process flow 200 as shown in FIG. 33.

FIGS. 24 through 32 schematically illustrate the cross-sectional views and top views of packages 96 in accordance with some embodiments of the present disclosure. Some of the details are not shown, and these details may be found referring to FIGS. 11 through 23. In these figures, two tiers of device dies 60 are illustrated to represent the likely multiple tiers of device dies 60 as shown in FIG. 23. Functional (active) bond pads 52A and 152A, dangling bond pads 52B, and dummy bond pads 152B are illustrated. Some of bond pads are illustrated as 52A/52B to indicate these bond pads may be functional bond pads 52A or dangling bond pads 52B. Similarly, some of bond pads are illustrated as 152A/152B to indicate these bond pads may be functional bond pads 152A or dummy bond pads 152B. It is appreciated that although filling dielectric regions 72 (FIG. 23) are not shown in FIGS. 24 through 32, dielectric regions 72 may be (or may not be) in packages 96 as shown in FIGS. 24 through 32.

Figure 24:
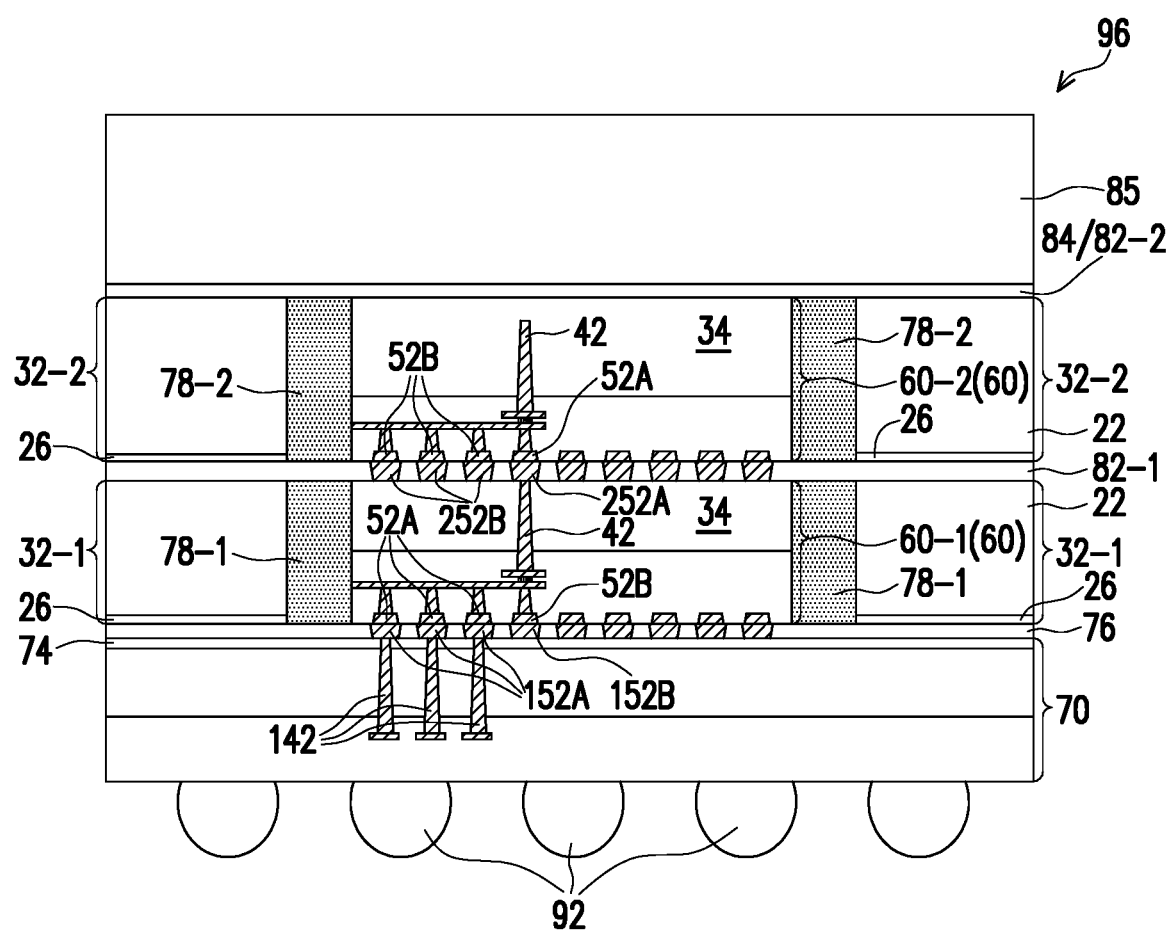
FIGS. 24 through 32 illustrate the cross-sectional views and top views of some packages with stacked dies in accordance with some embodiments.

In accordance with some embodiments of the present disclosure, as shown in FIG. 24, bond pads (including 152A and 152B) formed on tier-1 die 70 are all overlapped by tier-2 die 60-1, and there are no bond pads formed directly under and in contact with dielectric regions 78-1 and dummy dies 32-1. FIG. 25 illustrates an amplified view of bond pads 52A, 52B, 152A, and 152B.

Figure 26:
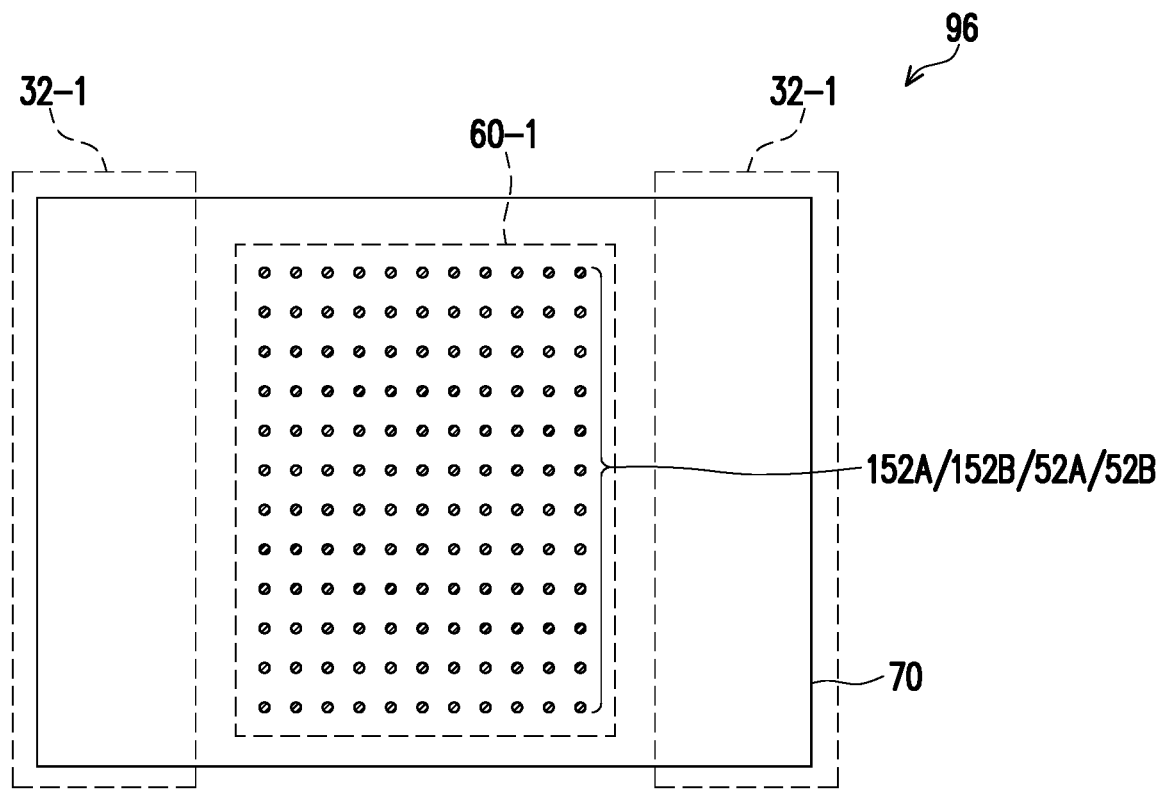

FIG. 26 illustrates a top view of bond pads 52A, 52B, 152A, and 152B, tier-1 die 70, tier-2 die 60-1, and dummy dies 32-1. In accordance with some embodiments of the present disclosure, bond pads 52A, 52B, 152A, and 152B form an array, and are limited in the region covered by tier-2 die 60, with no bond dies outside of the region covered by tier-2 die 60-1.

Figure 27:
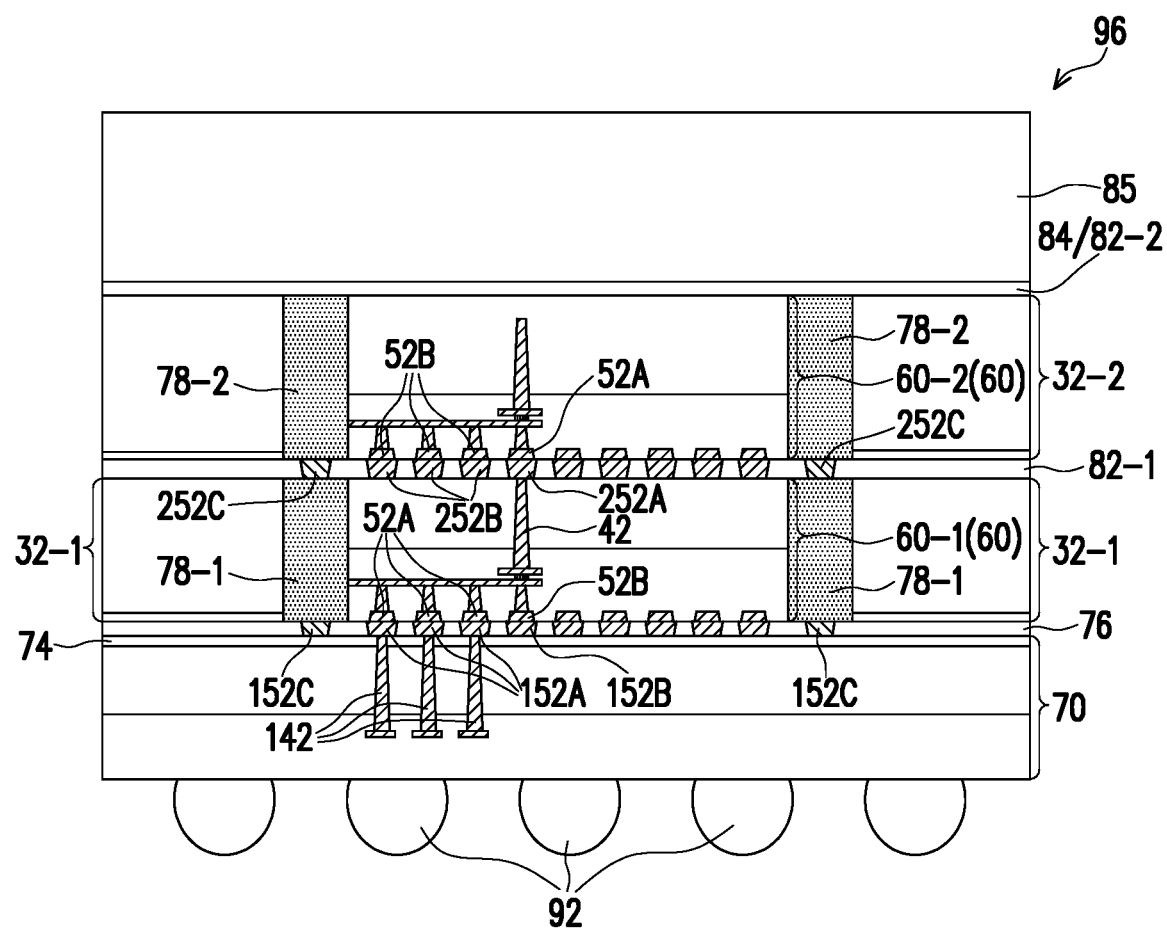
Figure 28:
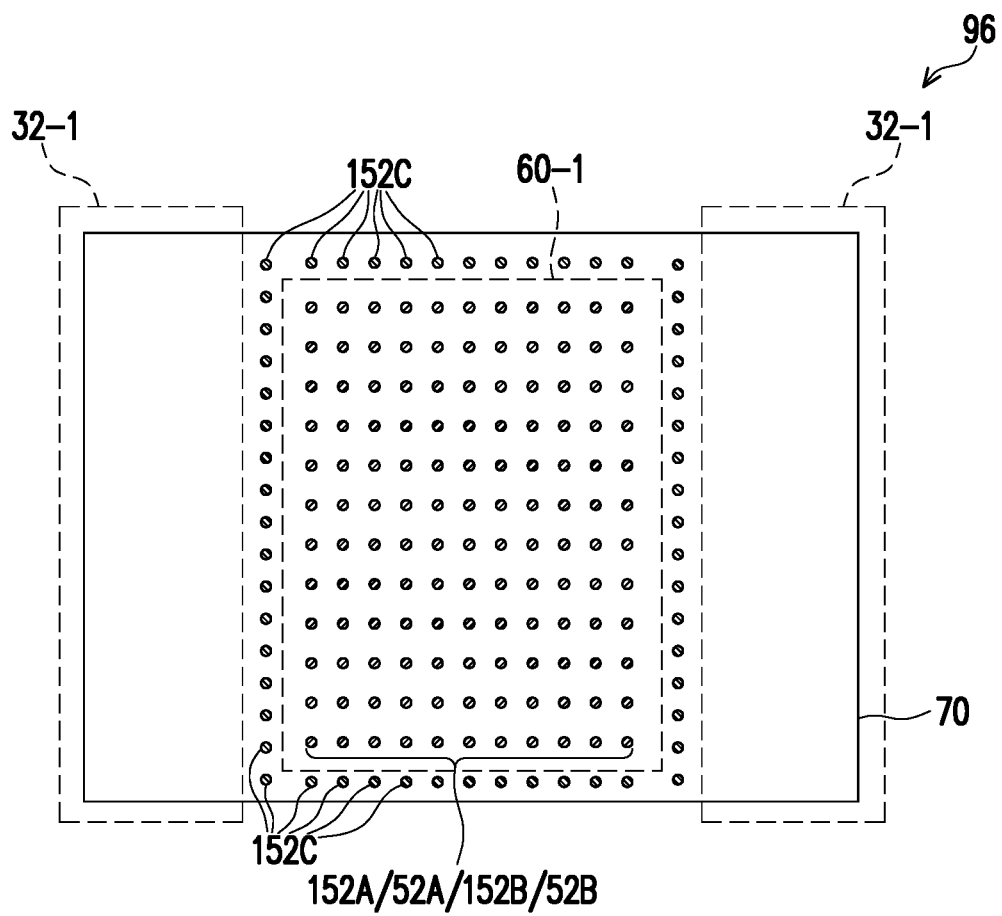

FIGS. 27 and 28 illustrate a top view and a cross-sectional view, respectively, of package 96 in accordance with some embodiments. These embodiments are similar to the embodiments in FIGS. 24 and 26, except that dummy bond pads 152C are further formed in a region overlapped by dielectric regions 78-1. Accordingly, in package 96, dummy pads 152C are electrically floating, with the top surface of bond pads 152C being in contact with the bottom surface of dielectric regions 78-1. Furthermore, bond pads 152C are fully enclosed in dielectric regions. In the formation of bond pads, the edge portions of a dense pad region such as the pad array may be non-uniform, for example, with the edge portions of the pad array polished more or less than the center portions of the pad array. By forming dummy pads 152C, the non-uniformity is concentrated in dummy pads 152C, which are edge portions of the pad array, while bond pads 152A and 152B are more uniform.

Figure 29:
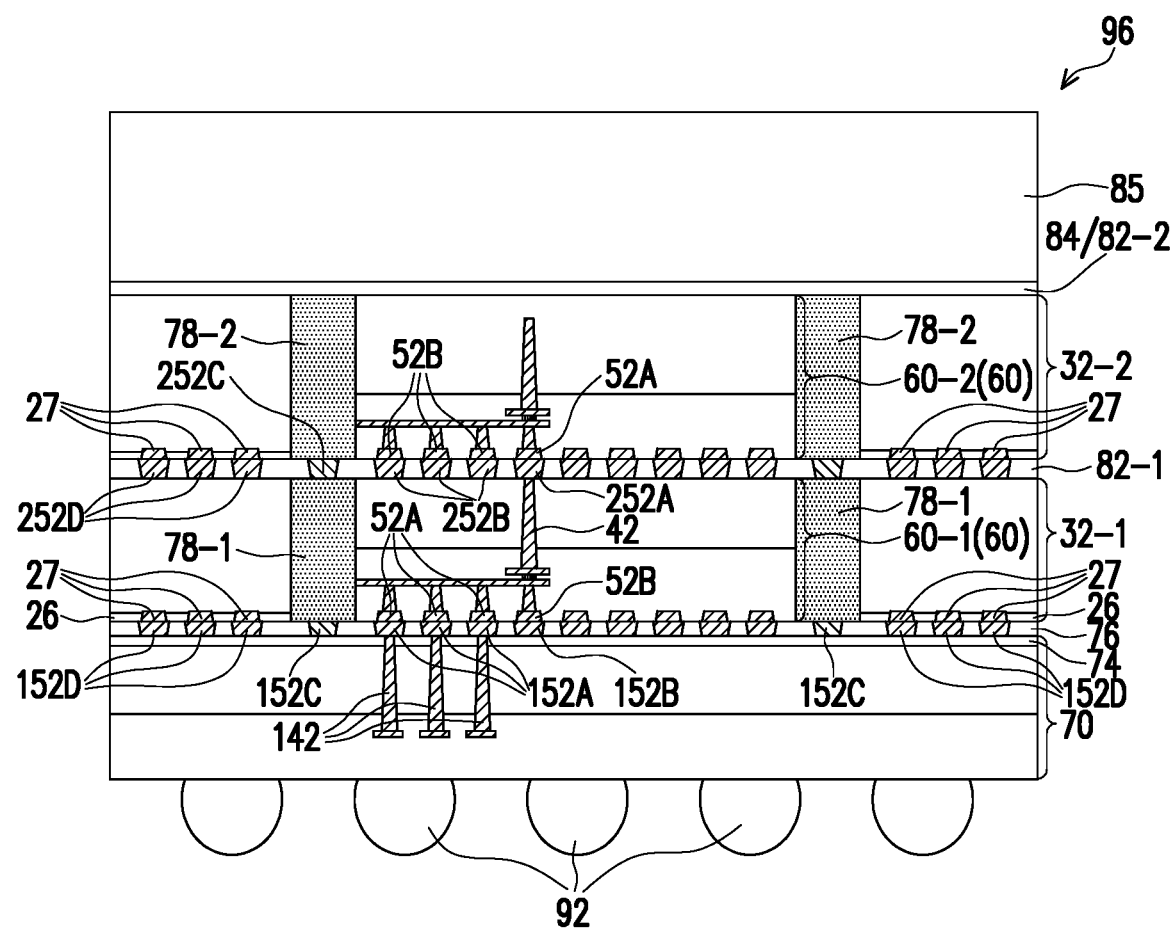
Figure 30:
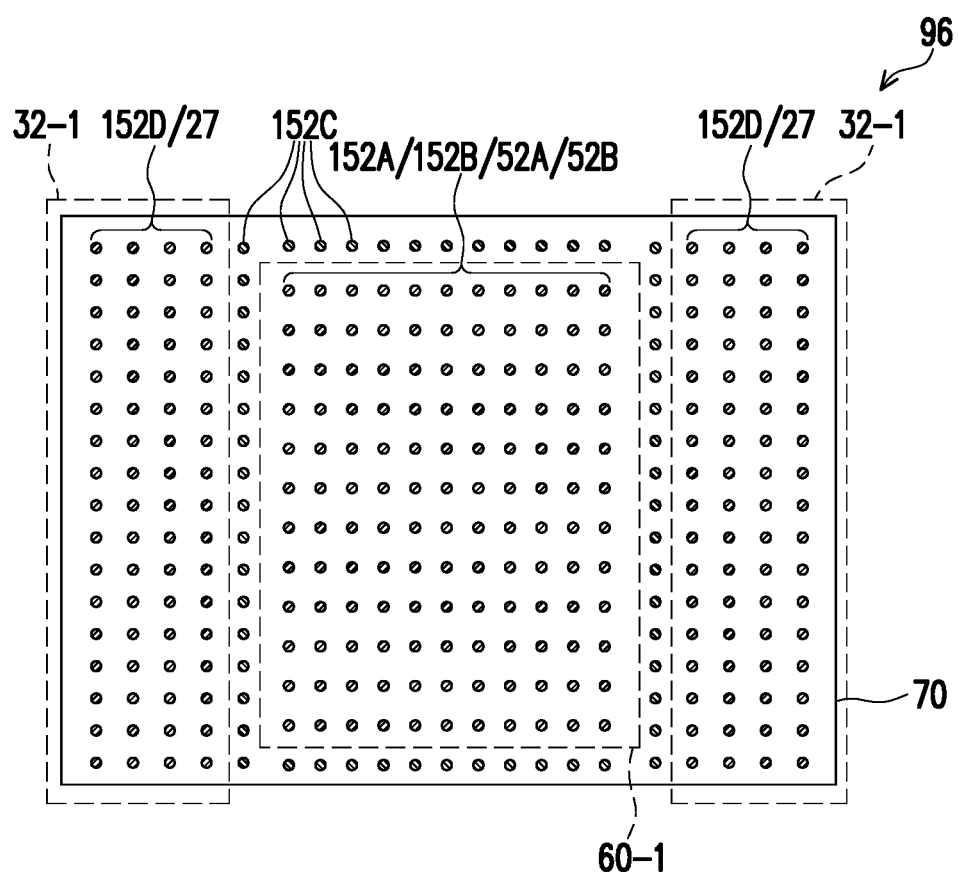

FIGS. 29 and 30 illustrate a top view and a cross-sectional view, respectively, of package 96 in accordance with some embodiments. These embodiments are similar to the embodiments in FIGS. 24 and 26, except that dummy bond pads 152C and 152D are further formed in a region overlapped by dielectric regions 78-1 and dummy dies 32-1. In package 96, dummy pads 152C and 152D are electrically floating, with the top surface of bond pads 152C being in contact with the bottom surface of dielectric regions 72, and the top surfaces of bond pads 152D being in contact with the bottom surface of dummy dies 32. In accordance with some embodiments, dummy pads 152C and 152D are fully enclosed in dielectric regions. In accordance with alternative embodiments, bond pads 152D are bonded to bond pads 27 in dummy dies 32-1. The formation of dummy pads 152C and 152D improves the uniformity in the planarization process for forming pads 152A and 152B.

Figure 31:
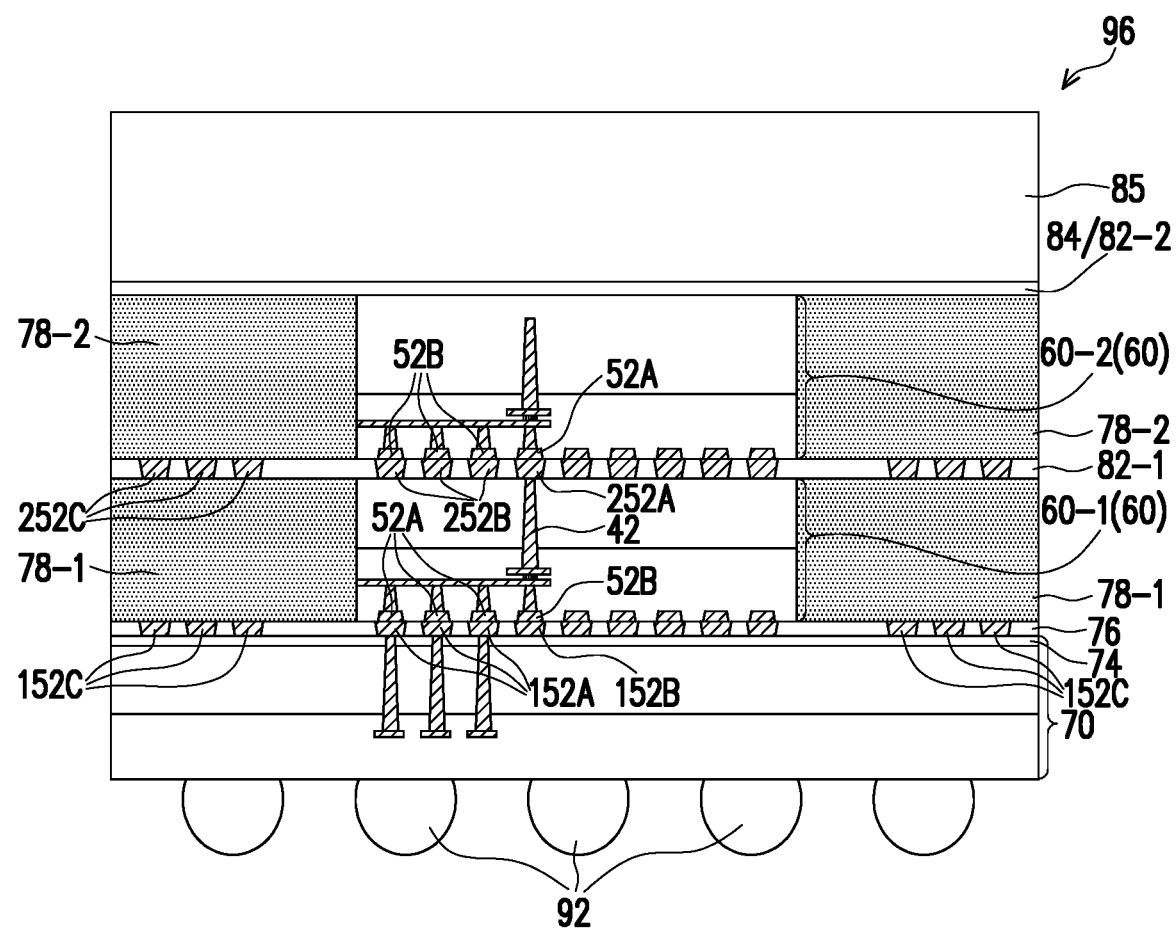
Figure 32:
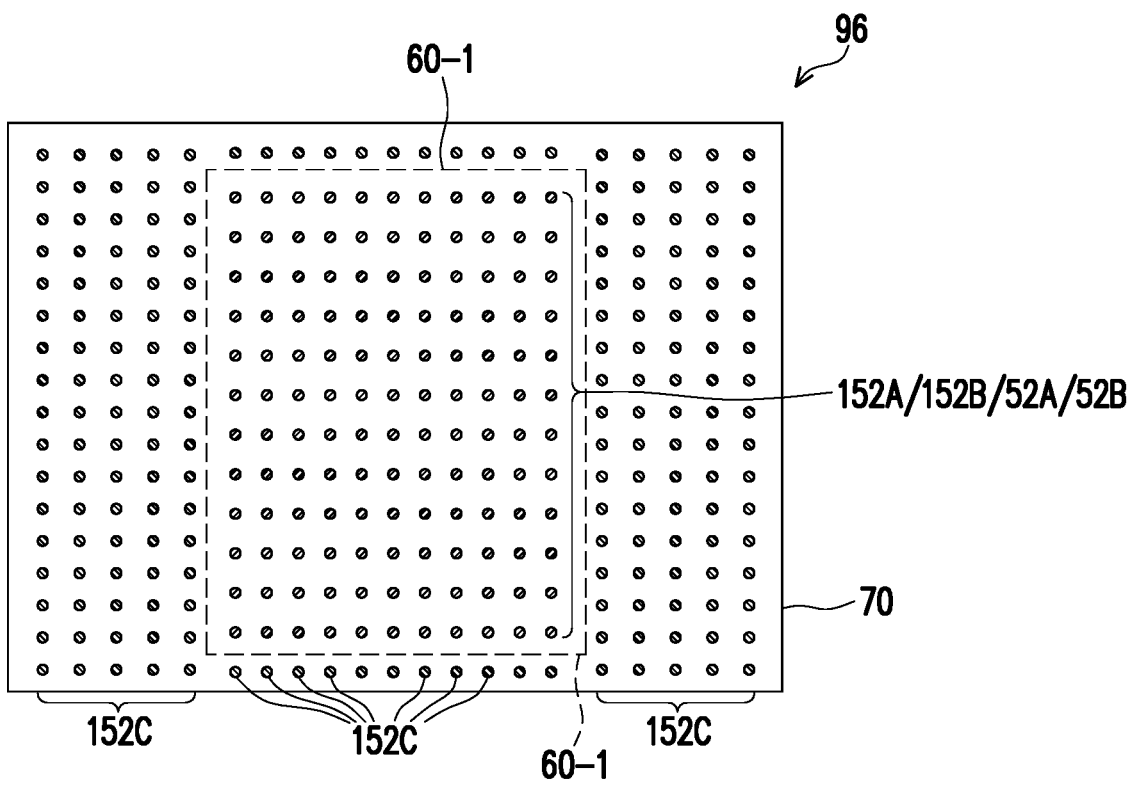

FIGS. 31 and 32 illustrate a top view and a cross-sectional view, respectively, of package 96 in accordance with some embodiments. These embodiments are similar to the embodiments in FIGS. 24 and 26, except that no dummy dies 32 are adopted. Dummy bond pads 152C are further formed in a region overlapped by dielectric regions 78-1. Accordingly, in package 96, dummy pads 152C are electrically floating, with the top surfaces of bond pads 152C being in contact with the bottom surface of dielectric regions 72. Furthermore, dummy pads 152C are fully enclosed in dielectric regions. The formation of dummy pads 152C improves the uniformity in the planarization process for forming bond pads 152A and 152B.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming an additional dielectric layer and dummy pads in the additional dielectric layer in a lower-tier die, the dangling pads in an upper-tier die are bonded to the dummy pads, rather than being in contact with a dielectric material. The bond strength is thus improved.

In accordance with some embodiments of the present disclosure, a method comprises polishing a semiconductor substrate of a first die to reveal first through-vias that extend into the semiconductor substrate; forming a dielectric layer on the semiconductor substrate; forming a plurality of bond pads in the dielectric layer, wherein the plurality of bond pads comprise first active bond pads and first dummy bond pads, wherein the first active bond pads are electrically coupled to the first through-vias; and bonding the first die to a second die, wherein both of the first active bond pads and the first dummy bond pads are bonded to corresponding bond pads in the second die. In an embodiment, the first active bond pads are bonded to a second plurality of active bond pads in the second die, and the first dummy bond pads are bonded to dangling bond pads in the second die, and wherein both the second plurality of active bond pads and the dangling bond pads are electrically connected to integrated circuit devices in the second die. In an embodiment, the first die and the second die are bonded through hybrid bonding. In an embodiment, the method further comprises bonding a dummy die to the first die. In an embodiment, the plurality of bond pads further comprise second dummy bond pads, and the dummy die further comprises third dummy bond pads bonded to the second dummy bond pads. In an embodiment, the method further comprises disposing a filling dielectric material to encircle the second die; planarizing the second die and the filling dielectric material, until second through-vias in the second die are exposed; and forming third active bond pads electrically coupling to the second through-vias. In an embodiment, the plurality of bond pads further comprise fourth dummy bond pads, and top surfaces of the fourth dummy bond pads are in contact with the filling dielectric material. In an embodiment, the first die is a logic die, and the second die is a memory die. In an embodiment, the method further comprises stacking a third die identical to the second die over the second die, wherein no bond pads in the second die and also bonded to the third die are used as dangling bond pads.

In accordance with some embodiments of the present disclosure, a method comprises forming a first die, which comprises a first semiconductor substrate; and a first through-via penetrating through the first semiconductor substrate. The method further comprises forming a second die comprising a second semiconductor substrate; a second through-via penetrating through the second semiconductor substrate; a first active bond pad; and a first dangling bond pad. The second die is bonded over the first die, wherein the first active bond pad is electrically coupled to first die through a second active bond pad between the first die and the second die, and the first dangling bond pad is bonded to a first dummy pad between the first die and the second die. In an embodiment, the method further comprises placing the first die over a carrier; encapsulating the first die in a filling dielectric material; forming a dielectric layer overlapping the first die and the filling dielectric material; and forming the second active bond pad and the first dangling bond pad in the dielectric layer. In an embodiment, the method further comprises performing a gap filling process to embed the second die in a gap-filling material, wherein the gap-filling material is over and contacts a top surface of a second dummy pad, with the second dummy pad being between the first die and the second die. In an embodiment, the method further comprises bonding a dummy die to the first die, wherein the dummy die contacts a third dummy pad between the first die and the second die, and the third dummy pad is at a same level as the second active bond pad and the first dummy pad. In an embodiment, the dummy die further comprises a fourth dummy pad bonded to the third dummy pad in the dummy die. In an embodiment, before the second die is bonded to the first die, the first dummy pad is electrically floating. In an embodiment, the method further comprises polishing the first semiconductor substrate to reveal the first through-via; forming a dielectric layer over and contacting the first semiconductor substrate; and forming the second active bond pad and the first dummy pad in the dielectric layer, wherein an entire bottom surface of the first dummy pad is in contact with a top surface of an additional dielectric layer in the first die.

In accordance with some embodiments of the present disclosure, package of integrated circuit devices comprises a first die comprising a first semiconductor substrate; a first through-via penetrating through the first semiconductor substrate; and a first dielectric layer over and contacting the first semiconductor substrate; a second dielectric layer over the first die; a first active bond pad in the second dielectric layer, the first active bond pad is over and contacting the first through-via; a first dummy bond pad in the second dielectric layer, wherein an entire bottom surface of the first dummy bond pad is over and contacting the first dielectric layer; and a second die comprising a second active bond pad over and bonded to the first active bond pad; and a dangling bond pad over and bonded to the first dummy bond pad. In an embodiment, the first die is a logic die, and the second die is a memory die. In an embodiment, the package further comprises a second dummy bond pad in the second dielectric layer; and a filling dielectric material encircling the second die, wherein the filling dielectric material contacts a top surface of the second dummy bond pad. In an embodiment, the package further comprises a second dummy bond pad in the second dielectric layer; and a dummy die over and contacting the second dummy bond pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
   a first die comprising:
      a first semiconductor substrate;
      a first through-via penetrating through the first semiconductor substrate; and
      a first dielectric layer over and contacting the first semiconductor substrate;
   a second dielectric layer over the first die;
   a first active bond pad in the second dielectric layer, the first active bond pad is over and electrically coupling to the first through-via;
   a first dummy bond pad in the second dielectric layer; and
   a second die comprising:
      a second active bond pad over and bonded to the first active bond pad; and
      a dangling bond pad over and bonded to the first dummy bond pad.
2. The package of claim 1, wherein the first die is a logic die, and the second die is a memory die.
3. The package of claim 1, wherein the first active bond pad is a functional pad having currents flowing through, and the first dummy bond pad has voltages, and is configured not to have currents flowing through.

4. The package of claim 1, wherein the first dummy bond pad is a terminal pad, with all bottom surfaces of the first dummy bond pad being in contact with dielectric materials.

5. The package of claim 4, wherein all sidewalls of the first dummy bond pad are further in contact with additional dielectric materials.

6. The package of claim 1 further comprising a die stack over and bonded onto the second die, wherein the die stack comprises a plurality of dies identical to the second die, and each of the plurality of dies comprises:
   an additional active bond pad vertically aligned to the first active bond pad and the second active bond pad; and
   an additional dangling bond pad over and vertically aligned to the first dummy bond pad.

7. The package of claim 1 further comprising:
   a second dummy bond pad in the second dielectric layer; and
   a gap-filling dielectric material encircling the second die, wherein the gap-filling dielectric material contacts a top surface of the second dummy bond pad.

8. The package of claim 1 further comprising:
   a second dummy bond pad in the second dielectric layer; and
   a dummy die over and bonding to the first die, wherein the dummy die comprises a third dummy bond pad over and bonded to the second dummy bond pad, and the second dummy bond pad and the third dummy bond pad are electrically floating.

9. A package comprising:
   a first die comprising:
      a first semiconductor substrate;
      a dielectric layer over the first semiconductor substrate;
      a first dummy bond pad over the first die and in the dielectric layer; and
   a second die comprising:
      a second semiconductor substrate;
      an integrated circuit at a surface of the second semiconductor substrate; and
      a dangling bond pad over and bonded to the first dummy bond pad, wherein the dangling bond pad and the first dummy bond pad are electrically connected to the integrated circuit.

10. The package of claim 9, wherein the first dummy bond pad is a terminal node of an electrical path comprising the integrated circuit, the dangling bond pad, and the first dummy bond pad.

11. The package of claim 9, wherein the first die and the second die are configured so that voltages are provided to the first dummy bond pad, and no current flows through the first dummy bond pad.

12. The package of claim 9 further comprising a dummy die over and bonded to the first die, wherein the first die further comprises a second dummy bond pad, and the dummy die further comprises a third dummy bond pad bonded the second dummy bond pad.

13. The package of claim 9 further comprising a gap-filling dielectric material encircling and contacting the second die, wherein the first die further comprises a second dummy bond pad in physical contact with the gap-filling dielectric material.

14. The package of claim 9 further comprising a plurality of dies over and stacked onto the second die, wherein each of the plurality of dies comprises:
   an additional dangling bond pad bonding to an additional dummy pad in a respective underlying one of the plurality of dies.

15. The package of claim 14, wherein the plurality of dies are identical to the second die.

16. A package comprising:
   a plurality of device dies forming a die stack, wherein each of the plurality of device dies comprises:
      a semiconductor substrate;
      a circuit at a surface of the semiconductor substrate;
      a through-via penetrating through the semiconductor substrate;
      a top surface dielectric layer;
      a dummy bond pad in the top surface dielectric layer;
      a bottom surface dielectric layer; and
      a dangling bond pad in the bottom surface dielectric layer, wherein each of the dangling bond pad in an upper one of the plurality of device dies is bonded to the dummy bond pad in an underlying one of the plurality of device dies, and the dummy bond pad is a terminal node of an electrical path comprising the dummy bond pad, the dangling bond pad, and the circuit.

17. The package of claim 16, wherein the plurality of device dies are memory dies.

18. The package of claim 16 further comprising an additional die underlying and bonding to the die stack.

19. The package of claim 18 further comprising a dummy die free from circuits therein, wherein the dummy die is over and bonded to the additional die, and the additional die comprises a first dummy bond pad, and the dummy die comprises a second dummy bond pad bonding to the first dummy bond pad.

20. The package of claim 16, wherein the plurality of device dies are identical to each other.

* * * * *